US012640467B2

(12) United States Patent
Caruso et al.

(10) Patent No.: US 12,640,467 B2
(45) Date of Patent: May 26, 2026

(54) DECORATIVE RADOME AND METHOD OF PRODUCING THE SAME

(71) Applicant: MOTHERSON INNOVATIONS COMPANY LIMITED, London (GB)

(72) Inventors: Dean Caruso, Lonsdale (AU); Simon Belcher, Lonsdale (AU); Scott Edwards, Lonsdale (AU); Tim Symonds, Lonsdale (AU); Garry Gordon Leslie Fimeri, Lonsdale (AU); Bastian Stoehr, Lonsdale (AU)

(73) Assignee: Motherson Innovations Company Limited, London (GB)

( * ) Notice: Subject to any disclaimer, the term of this patent is extended or adjusted under 35 U.S.C. 154(b) by 0 days.

(21) Appl. No.: 18/782,180

(22) Filed: Jul. 24, 2024

(65) Prior Publication Data

US 2025/0015488 A1      Jan. 9, 2025

Related U.S. Application Data

(62) Division of application No. 17/285,422, filed as application No. PCT/EP2019/077800 on Oct. 14, 2019, now Pat. No. 12,080,942.

(51) Int. Cl.
*H01Q 1/42*      (2006.01)
*B29C 45/14*      (2006.01)
(Continued)

(52) U.S. Cl.
CPC ....... *H01Q 1/422* (2013.01); *B29C 45/14688* (2013.01); *H01Q 1/44* (2013.01);
(Continued)

(58) Field of Classification Search
CPC ............................ H01Q 1/422; B29K 2055/02
See application file for complete search history.

(56) References Cited

U.S. PATENT DOCUMENTS 5,172,024 A     12/1992  Broussoux et al.
6,175,335 B1 *   1/2001  Ishikawa ................ H01Q 15/08
                                                    343/753
(Continued)

FOREIGN PATENT DOCUMENTS

DE     102008030976 A1     3/2010
DE     102013223783 A1 *   5/2015   ........... H01Q 1/3283
(Continued)

OTHER PUBLICATIONS

International Search Report dated May 25, 2020 of International Application No. PCTEP2019077800.
(Continued)

*Primary Examiner* — Cachet I Proctor
(74) *Attorney, Agent, or Firm* — Jones Day

(57)      ABSTRACT

A decorative radome includes a first layer comprising a radio-transmissive polymer, the first layer having a front surface; a second layer comprising a radio-transmissive polymer, the second layer having a rear surface; and a decorative layer, between at least a portion of the first and second layer, comprising a layer of metal or an alloy comprising a metal and a metalloid. The second layer directly or indirectly abuts the decorative layer and is directly adhesion bound or indirectly connected to the first layer, wherein at least one of the first or second layers is comprised of a polymer formed by overmolding at a barrel nozzle temperature below 300 degrees Celsius.

36 Claims, 5 Drawing Sheets

(51) Int. Cl.

| | | |
|---|---|---|
| *H01Q 1/44* | (2006.01) |
| *B29K 55/02* | (2006.01) |
| *B29K 669/00* | (2006.01) |
| *B29L 31/34* | (2006.01) |
| *C23C 14/20* | (2006.01) |

(52) U.S. Cl.

CPC ............... *B29C 2045/14877* (2013.01); *B29K 2055/02* (2013.01); *B29K 2669/00* (2013.01); *B29L 2031/3456* (2013.01); *C23C 14/205* (2013.01)

(56)     References Cited

U.S. PATENT DOCUMENTS

| | | | |
|---|---|---|---|
| 2003/0052810 A1 | 3/2003 | Artis et al. | |
| 2012/0119961 A1 | 5/2012 | Mayer | |
| 2014/0218263 A1* | 8/2014 | Burdenski | H01Q 1/32 |
| | | | 156/278 |
| 2017/0036594 A1* | 2/2017 | Roberts | F21S 45/50 |
| 2017/0136739 A1* | 5/2017 | Okumura | B32B 37/14 |
| 2017/0324157 A1 | 11/2017 | Shurish | |
| 2018/0159207 A1* | 6/2018 | Shurish | H01Q 1/421 |
| 2018/0215086 A1 | 8/2018 | Geise | |
| 2019/0013576 A1* | 1/2019 | Mayer Pujadas | G02B 1/11 |
| 2019/0305411 A1* | 10/2019 | Mayer Pujadas | H01Q 1/42 |

FOREIGN PATENT DOCUMENTS

| | | | |
|---|---|---|---|
| DE | 102015004204 A1 | 8/2015 |
| JP | 2011 093378 | 5/2011 |
| JP | 2014 070899 A | 4/2014 |
| JP | 2017 090384 | 5/2017 |
| JP | 2018 066706 | 4/2018 |
| WO | WO 2018/010762 | 1/2018 |
| WO | WO 2018/151855 A1 | 7/2018 |

OTHER PUBLICATIONS

Written Opinion dated May 25, 2020 of International Application No. PCTEP2019077800.

Japan Patent Office, Appl. No. 2021-545326, Office Action.

* cited by examiner

DECORATIVE RADOME AND METHOD OF PRODUCING THE SAME

CROSS-REFERENCE TO RELATED APPLICATIONS

This application is a Divisional of U.S. patent application Ser. No. 17/285,422, filed on Apr. 14, 2021, which is a National Stage Entry of International Patent Application No. PCT/EP2019/077800, filed on Oct. 14, 2019, which claims the benefit of foreign priority to German Patent Application No. DE 10 2019 100 669.4, filed on Jan. 11, 2019, German Patent Application No. DE 10 2019 101 033.0, filed on Jan. 16, 2019, Australian Patent Application No. AU 2018903894, filed on Oct. 15, 2018, and Australian Patent Application No. AU 2019902697, filed on Jul. 29, 2019, each of which is hereby incorporated by reference herein in its entirety for all purposes.

BACKGROUND

1. Field of the Invention

The present invention relates to protective covers for radar systems known as radomes. Specifically, the invention relates to multi-layered radomes including decorative visual features. Such radomes are particularly useful in the automotive industry.

2. Related Art

Radio Detection and Ranging (RADAR) Systems work on the basis that illuminating radio waves (radar signals), emitted from a transmitter, are reflected or scattered by solid objects. These reflected radar waves are then detected by a receiver, which is generally proximal to the transmitter, allowing the radar system to detect an object.

Typically, radio waves are reflected when travelling between mediums having different electric conductivity. As such, radar systems are particularly effective at detecting electrically conductive materials, such as metals.

Since their development in the early 20$^{th}$ century, radar systems have evolved and have been miniaturised such that they are now integrated into a range of everyday devices. One common everyday use of radar is in driver assistance systems in vehicles. Radar is used for a variety of warning systems, semi-autonomous systems and autonomous systems in vehicles. Such systems include proximity detection, which can be used for parking assistance, adaptive cruise controls, crash avoidance and blind spot detection. Further, radar, in combination with light illuminating detection and ranging (LIDAR) systems provide the sensing systems being developed for autonomous vehicles.

Typically, for radar systems to function optimally, the radar transmitter and receiver should be positioned central to the desired detection zone, and at a height sufficient and/or appropriate to provide a sufficient detection range, as radar systems used on vehicles require line-of-sight. In vehicles this is typically at the front and rear of the vehicle in an upper portion of, or above, a vehicles front grill (at the front) or at a central point (both vertically and horizontally) on the back of the vehicle. Problematically, these areas typically include components with a metallic finish for example metallic grills, bumpers or the badge of the vehicle.

As it is not desirable to externally view the radar system, and as the system need to be protected from environmental damage, radar systems are typically located behind a radome. A radome is a protective cover which is substantially radio-wave transmissive, and therefore does not attenuate the radio signals. Suitable materials for providing a radome include plastics which are electrically insulating. However, integration of such plastic radomes, when a metallic finish is desired, has been difficult to achieve. Typical metallic finishes, such a chromium films on plastic, attenuate radio signals and therefore are not suitable for use in radomes. For example the U.S. patent application Ser. No. 16/001,423 being a continuation-in-part of U.S. patent application Ser. No. 15/439,188, filed on Feb. 22, 2017, which is a continuation-in-part of U.S. patent application Ser. No. 14/936,024, filed on Nov. 5, 2015, now U.S. Pat. No. 9,656,601, which is a continuation-in-part of U.S. patent application Ser. No. 14/374,376, filed on Jul. 24, 2014, now U.S. Pat. No. 9,181,616, which is a national stage entry of International Patent Application No. PCT/AU2013/000047, filed on Jan. 24, 2013, which claims the benefit of priority to Australian Patent Application No. 2012900267, filed on Jan. 24, 2012, all of which are hereby incorporated by reference in their entirety for all purposes, discloses reflective coatings and a rearview assembly device for displaying a state of a vehicle. It is proposed that the reflective coating is a chromium-based reflective coating.

Consequently, techniques have been developed to provide plastic radomes with a metallic appearance. One such technique is disclosed in U.S. Pat. No. 6,328,358 which discloses a grill including a radome section which includes at least four layers, including multiple plastic layers. Some of the plastic layers are provided with recesses which have a thin film of indium applied. The indium is deposited to cover specific portions of the radome, while other portions were not covered to allow insular deposition of the indium. However, this technique is limited by the requirement for the indium to be deposited as a thin film, otherwise it becomes conductive. Indium is a soft metal with a low melting temperature and is therefore easily damaged. Consequently, a complex protective coating, including a primer (or varnish), needs to be applied over the thin film, otherwise it is exposed to weathering, damage and oxidation.

A further example includes US patent application US 2017/0057424 A1, which utilises an interference film stack of up to 30 layers. Such complex film stacks can result in significant production costs and time, as well as introducing a number of quality control issues and points of failure. Other radomes utilise complex combinations of films, paints, deposited metals and complex heat masking, again resulting in high production time and costs.

EP1560288 describes alternative means to provide a radome with a visually metallic and/or metallic component. This document discloses the deposition of a thin film (10 nm to 50 nm) of Tin and/or an alloy of Tin on a transparent substrate. The substrate is then overlayed with a further opaque backing plate, which in practice, is adhered to the front layer. However, the use of an adhesive increases production complexity and costs and may result in the components being susceptible to delamination between the first and the second layer. This leads to radio wave attenuation and inaccuracies in the radar system.

Present on market radomes have demonstrated a high failure rate, and low resistance to delamination of the multiple layers forming the radome. Therefore, it is desirable to create a radome, which can incorporate a decorative finish (particularly a reflective finish which mimics metal) into the radome, and which is bright, radio-transmissive, i.e. preferably transparent for electromagnetic radiation in the radar range, preferably 10 MHz to 130 GHz, preferably 20

GHZ to 100 GHz, more preferred 20 GHz to 30 GHz, 70 GHz to 80 GHz and/or 90 GHz to 100 GHZ, most preferably 24 GHz, 77 GHz or 93 GHZ, robust and resistant to environmental damage and wear.

A decorative finish of the radome is often used to provide a logo or emblem. Such emblems are traditionally employed to convey styling and branding on vehicles. To enhance brand differentiation there is a desire to enhance the logo or emblem. When combining such radomes with such emblems however opposing desires exist.

On the one hand the transparency of the radome for the radar radiation should be not negatively influenced whereas it is also desired to enhance the emblem, for example by illumination. The illumination could be the emblem or logo itself, a ring around the emblem of the entirety of the radome or car badge. Furthermore the emblem could be enhanced by avoiding or removal of depositions, for example dust, ice or the like.

These enhancement lead to additional elements to be located in the radome and thus are potentially negatively influencing the transparency of the radome for radar radiation. The additional parts, especially for transmitting, diffusing, reflecting and piping light, are opposite to what is required for optimal radar performance. Preferably a radome requires a uniform cross section of optimal thickness tuned according to the dielectric properties of a material.

It is thus desired to implement such additional functionalities in the radome without negatively influencing the core function to cover the radar antenna without influencing the transparency.

In this regard the U.S. patent application Ser. No. 16/443, 188, filed on Jun. 17, 2019, being a continuation-in-part of U.S. patent application Ser. No. 15/743,556 filed on Jul. 8, 2016, published as US2018/0202626A1, now U.S. Pat. No. 10,323,817, which is a national stage entry of International Patent Application No. PCT/EP2016/066355, filed on Jul. 8, 2016, which claims the benefit of priority to Australian Patent Application No. 2015902723, filed on Jul. 10, 2015, all of which are hereby incorporated by reference in their entirety for all purposes, discloses a light assembly and a vehicle design element including such a light assembly. It is proposed that the design element, preferably formed as radome, is surrounded by a light guide to direct light in a radial direction into the radome. Furthermore it is proposed that the light assembly comprises a bridging light member that is located behind the design element to provide a laminar illumination of the design element. This construction has proven itself. However it has been found that especially by the bridging element a selective illumination of parts of the design element, preferably with different colours and/or allowing a change between the illuminated areas is not so easy to be realized. Thus there is also the need to provide a further developed illumination function overcoming these shortfalls of the illumination device known in the state of the art.

The above discussion of background is included to explain the context of the present invention. It is not to be taken as an admission that any of the material referred to was published, known or part of the common general knowledge at the priority date of any one of the claims.

SUMMARY

The present invention provides a method of producing a decorative radome, comprising; providing a radio-transmissive substrate having a first surface and a second surface; applying, to at least a portion of the second surface of the, preferably radio-transmissive, substrate, a decorative layer comprising a layer of a metal or an alloy comprising a metal and a metalloid; and overmolding at least the decorative layer with a radio-transmissive polymer to provide an over-molded layer.

Many thin-coating layers are tensile at room temperature, which, when applied to plastic substrates, visually distort (for example craze) when exposed to elevated temperatures. It appears that this is due to the difference in coefficient of thermal expansion (CTE) which are typically in the order of three to six times lower for the thin films and/or coating layers compared to the plastic substrates.

The process of overmolding inherently exposes thin-coatings to high temperatures, as molten plastic resins as applied during the second-shot of the overmolding process at nozzle temperatures up to, or above, 300° C. As such, the overmolding of a substrate having a thin-coating (such as a reflective layer) may cause thermal expansion of the coating, preferably thin-coating, and the substrate, which is expected to cause visual distortion of the thin-coating and damage the appearance of the coating. However, the present invention allows for the production of a unitary, multilayered article by directly overmolding a, preferably deposited, decorative layer deposited on a substrate, without the need for thermal masks over the decorative layer. Furthermore, the overmolding process removes the need for adhesives to adhere the first and second layer, between which the decorative layer is encompassed.

Overmolding directly onto a deposited thin-coating provides many advantages over the current methods of providing such decorative radomes. The deposition of thin-coatings via deposition techniques such as physical vapour deposition (PVD) allows for simple high-throughput production of substrates provided with a decorative layer reducing the likelihood of radio signal distortion or attenuation. Further, thin-coating deposition via PVD allows the thickness of the deposited layer to be substantially uniform. This has the advantage of reducing any refraction of the radar signal. Additionally, the direct overmolding of the decorative layer encases the layer, thereby protecting it from the elements, electrically isolating it, and reduces the likelihood of water ingress between the substrate and the overmolded layer, a problem encountered with multilayer radomes bound by adhesives.

To help reduce the likelihood of visual distortion of the decorative layer prior to overmolding, in some embodiments of the method, the substrate and the decorative layer are heated prior to overmolding. Preferably, the substrate and the decorative layer are heated to at least 60 degrees Celsius, or to at least 70 degrees Celsius, or to at least 75 Degrees Celsius, or to at least 80 degrees Celsius prior to overmolding. This reduces the rate of temperature change in the decorative layer during the second-shot of the overmolding process, thereby decreasing the degree of thermal expansion during overmolding and helping to reduce the likelihood of visual distortion of the decorative layer.

Further, reducing the nozzle temperature of the overmolding process, and consequently using a suitable polymer which can flow at the specified nozzle temperature, reduces the likelihood of visual distortion of the decorative layer. In some embodiments, the overmolded layer is formed with a barrel nozzle temperature at or below 300 degrees Celsius, or at or below 280 degrees Celsius, or at or below 250 degrees Celsius, or at or below 245 degrees Celsius during the overmolding process.

A particularly desirable use of the method of the present invention is to provide a badge for the front of a vehicle.

Typically, such badges consist of three dimensional symbols which traditionally are chrome plated, or have a metallic appearance. Therefore, it is desirable to try and replicate such a badge in a manner that is suitable for use as a radome.

Consequently, in at least some embodiments, the decorative layer is applied to only a portion of the substrate to form a visual feature. This visual feature may be a symbol such as a logo, preferably car logo, or any other desired symbol. To recreate a three-dimensional visual feature, in some embodiments, the substrate may include a relieved portion and/or elevated portion on the second surface of the, preferably radio-transmissive, substrate, defining (at least a portion of) the visual feature. In some embodiments, the relieved portion is provided by a recess toward the first surface of the substrate and/or the elevated portion is provided by a projection extending from the second surface. In some embodiments, the decorative layer may be applied to the relieved portion and/or the elevated portion to provide a three dimensional decorative layer.

To replicate the metallic finish of many vehicle badges, it is desirable for the decorative layer to be a reflective layer. Consequently, in some embodiments the decorative layer is a reflective layer which is at least 35% reflective, or at least 45% reflective, or at least 50% reflective, or at least 55% reflective, especially with regard to the photopic reflectivity. As the radome is designed to encompass the decorative layer within two layers of polymer, it is desirable to measure the reflectivity as viewed from the 2nd surface (i.e. the external surface of a transparent layer).

The decorative layer is provided as a thin coating layer. In some embodiments, the average thickness of the decorative layer is 20-190 nm thick, or 40 to 170 nm thick, or 60 to 150 nm thick. Such thin coatings can be provided by multiple methods in the art. However, in some embodiments the decorative layer is deposited and/or applied by Physical Vapour Deposition (PVD). In some embodiments, the PVD method is magnetron sputtering, or evaporation, which may be resistive thermal evaporation or electron-beam evaporation. In some embodiments, the decorative layer is deposited by magnetron sputtering. PVD methods allow the deposition of a thin film at a uniform thickness, which helps control the residual stress characteristics of the deposited layer, thereby allowing a user and/or manufacturer to tune the characteristics layer. This helps control the Coefficient of Thermal Expansion of the decorative layer and thereby reduces the likelihood of visual distortion during overmolding.

Suitable metals for use in the method of the invention include indium and tin. Suitable metalloids for use in the method of the invention include germanium and silicon. Suitable metals for formation of an alloy with a metalloid include Aluminium. In some embodiments, the decorative layer comprises indium, or tin, or an alloy of Germanium. In some embodiments, the alloy of Germanium is Germanium and Aluminium, or Germanium and Silicon, or Germanium and Aluminium and Silicon. In some alternative embodiments, the alloy is Aluminium and Silicon or Silver and Germanium or Indium and Germanium.

In embodiments wherein the decorative coating comprises an alloy of Germanium, the alloy may comprise at least 25 wt % germanium, or at least 40 wt % germanium, or at least 45 wt % germanium, or at least 50 wt % germanium, or at least 55 wt % germanium.

Preferably the decorative layer acts as a frequency selective surface bandpass filter and/or comprises at least one repetitive pattern, wherein preferably the frequency selective surface bandpass filter is produced by structuring of the decorative layer after its application, preferably by laser etching.

By providing such a selective surface bandpass filter, i.e. a filter that is a thin, repetitive surface designed to reflect, transmit or absorb electromagnetic fields based on the different frequencies of the fields, it becomes possible to use for the decorative layer further materials that are highly reflective for visible light, like chrome. Thus the aesthetic outer appearance of the radome, preferably of the visual feature can be increased due to a higher reflectively compared to closed surfaces of other materials without negatively influencing the functionality of the radar unit covered by the radome as the decorative layer is transparent for radar radiation and thus not negatively influencing a transmission of radar radiation.

It is furthermore possible to provide simultaneously to the transparency for radar radiation a highly reflective area that gives the observer the impression of a closed reflective surface allowing to present the wanted visual effect. On the other hand, the pattern is designed such that it functions as a pass filter for electromagnetic radiation such as 27 or 77 GHZ, allowing the radar unit to function without any negative influence.

The frequency selective surface can be formed by a pattern using elements that are repeated periodically. Typically, these elements have a size less than 50 μm to ensure they cannot be easily seen by an observer. Furthermore it is possible to change the pattern from a fully periodic pattern to areas in which corrections to the shaping and sizing as well as occasional ornamental elements are provided to allow geometric effects on a three dimensional surface.

To prevent excessive refraction and distortion of radio wave signals traversing the radome it is preferable for the front and rear surfaces of the formed radome to be parallel or substantially parallel, for at least a portion of the radome, to provide a signal path of uniform thickness. Therefore, in some embodiments (once set) the overmolded layer provides a third surface which is parallel or substantially parallel, to the first surface of the, preferably transparent, radio-transmissive substrate, over at least a portion of the radome, the portion defining a signal path.

The substrate can be prepared in any desirable manner and in some embodiments the substrate is formed by injection moulding. Further, the substrate, and the overmolded layer can be formed of any suitable polymer and/or polymers, so long as the polymer is or the polymers are substantially radio-transmissive. In some embodiments the substrate and/or the overmolded layer are formed of Acrylonitrile Ethylene Styrene (AES), Acrylonitrile butadiene styrene (ABS), polycarbonate (PC), high-flow AES or acrylonitrile-(ethylene-propylene-diene)-styrene (AEPDS), a blend of thermoplastics, or PC-ABS blended thermoplastic.

In order to allow viewing of the decorative layer, in some embodiments at least one of either the substrate or the overmolded layer is substantially transparent to visible light. Preferably, the, preferably radio-transmissive, substrate is the layer substantially transparent to visible light. One particular suitable polymer is polycarbonate. Further, to improve contrast of the decorative layer, tune the colour and reflectivity, and to obscure viewing of underlying electronics, the layer opposing the transparent layer is substantially opaque. As such, in some embodiments, either the substrate or the overmolded layer is substantially opaque to visible light.

The method of the present invention may further comprise the step of applying an intermediate layer, preferably to at least a portion of the second surface of the radio-transmissive substrate and/or the decorative layer. The intermediate layer can play a decorative role in addition to, or in combination with, the decorative layer. For example the intermediate layer may be coloured and therefore may add colour to the decorative radome. Therefore, in at least some embodiments, the intermediate layer is coloured.

The intermediate layer might fulfil alternatively or in parallel further functions. For example the intermediate layer might provide a lighting for and/or illumination of the radome, preferably of the visual feature, the decorative elements and/or the logo. Alternatively or in addition the intermediate layer might provide a heating function and/or a cleaning function, preferably to remove mist, water, ice or the like from a surface of the radome. The cleaning function might comprise the generation of ultrasonic vibrations and/or sound, for example by a piezoelectric effect.

The intermediate layer might comprise a plurality of sublayers. At least two of the sublayers might provide different functions, preferably one of the before described functions. Also a combination of sublayers might provide at least one function or a combination of such functions.

Depending on the functionality the intermediate layer is located on the side of the decorative layer facing the substrate or the side of the decorative layer facing away from the substrate. For example for illuminating the decorative layer by the intermediate layer it is preferred that the intermediate layer is located on the side of the decorative layer facing away from the substrate.

To provide a lighting and/or illumination function the intermediate layer, preferably at least one of the sublayers, comprises at least one fibre optical device. The fibre optical device allows to direct and/or emit light through and/or into the radome. The light is preferably directed to the decorative layer. Due to a partly transparency of the decorative layer the light can be emitted through the decorative layer and thus illuminate it. In case the decorative layer is in form of a visual feature, for example to provide an emblem and/or logo, the emblem is thus illuminated.

To reach this aim the fibre optical preferably comprises at least one, preferably a plurality of fibre optic strings, especially arranged in tracks. This allows to match the shape of the fibre optical device to the shape of the emblem and/or logo. In this way the light is emitted selectively in the area of the emblem/logo without illuminating, at least illuminating to a lesser degree surrounding areas. Preferably the film can be located behind the decorative layer, i.e. on the side of the decorative layer facing the radar antenna.

The fibre optical device, preferably the fibre optical strings might be layered and/or embedded in the at least on intermediate layer and/or sublayer, preferably in form of at least one, preferably polymer, film. The use of such a film leads to a plurality of advantages, preferably allows to selectively locate the fibre optical devices in the area of the logo/emblem. Preferably the polymer film is overmolded with the overmolded layer.

Furthermore the use of a film allows to maintain a uniform cross section of the radome and to avoid empty spaces. Uneven cross sections and empty spaces, preferably occurring during an overmolding process, onto an uneven surface could lead to the effect that the radar transmission performance is negatively influenced.

Furthermore also the size of the illumination structure does not lead to a negative influence of the radar performance. Fibre optical devices allows to realise illumination structures having a diameter in the range of 125 μm. When embedding such a device, preferably the fibre optical strings in a film, the film can be manufactured quite thin, like in the range of 350 μm. As the structure comprising the film and/or the fibre optical device can be made of dielectric material such as glass or polymers and the size of the structure is an order of magnitude less than the wavelength of the usually used millimetre radars, interference with the radar signal is neglectable.

To case a connection of the fibre optical device and/or the film, especially to the substrate, the overmold and/or the decorative layer the can be provided with at least one adhesive promoter on at least one surface, preferably both surfaces.

The use of a fibre optical device furthermore allows to locate a light source and/or a light engine away from the field of view of the radar unit. In this way disturbances if the radar filed can be avoided.

The fibre optic device is connected with the at least one light engine, preferably LED light engine, via at least one connection element, wherein the connection element it at least partly located in and/or connected to the intermediate layer, the sublayer, the film and/or the overmolded layer.

Also multiple light sources or a light engine providing light of different colours and/or delivering light, preferably of different colours to different parts of the fibre optical device, preferably different fibre optical strings, can be used. In this way the fibre optical device can deliver different colours and/or it might be laid up in track formation to uniformly or selectively light up the radome, preferably the logo and/or emblem, preferably with different colours.

The intermediate layer, preferably at least one of the sublayers may provide a heating function. By the heating function any ice, water or dust can be removed from the surface of the radome.

In one alternative the heating function might be provided by providing at least one heating pad within the intermediate layer, preferably the sublayer. When using such heating devices, it is important to ensure that an attenuation and signal loss is avoided.

Thus it is important to provide heating pads that are as thin as possible, for example the pad can be provided by conductive printing thin tracks within a film.

When using such a heating pad it has to be ensured that a precise location of the pad with regard to the antenna is achieved to avoid negative impact on the sending and receiving capabilities. On the other hand a reduction of thickness of the heating pad is limited as the heating pad has to be on the other hand thick enough to provide sufficient rigidity and resistance to "survive" the production process and to provide enough heat energy.

To further reduce attenuation and signal losses in comparison to heating pads it is proposed in a other alternative that a heating wire is embedded in the intermediate layer.

By including the heating element in form of a heating wire in the intermediate layer by embedding it directly in a, preferably self-supporting, intermediate layer, the production becomes less complicate and thus less expensive as well as less fault prone. Also it becomes possible to locate a heating element more precisely relative to the antenna such that any attenuation or losses are avoided, at least significantly reduced. The use of such a heating wire furthermore allows to lead the wire around the intermediate layer, preferably the sublayer, the substrate layer and/or the overmolded layer, such that a terminal to connect the heating element with an energy source can be located on a side of the radome not visible from the side being opposite of the antenna and outside the field of view of the antenna and thus not influencing the emitting and receiving of radiation. In addition it allows to form the heating element as a frequency selective surface band pass filter and/or having a wire that has such a small diameter that it does not negatively influence the transmission of radiation and the heating element.

Further, in at least some embodiments, the intermediate layer, at least one of the sublayers and/or the decorative layer may, or may also, act to mask the application of the decorative layer on the radio-transmissive substrate. In such embodiments of the method, the intermediate layer, at least one sublayer and/or the decorative layer are deposited such that the intermediate layer and/or sublayer is not substantially overlaid, or not overlaid, by the decorative layer. Such masking can be utilised when shadow masking during the deposition of the decorative layer is difficult, or the appropriate detail cannot be achieved by shadow masking. In at least some embodiments, the intermediate layer and/or sublayer is used in conjunction with a shadow mask in the method of the present invention to allow selective application of a decorative layer to the radio-transmissive substrate.

The intermediate layer may be any suitable layer, and in a preferred embodiment, preferably to play a decorative role, the intermediate layer is and/or comprises an ink, dye, oil or other suitable liquid. The ink can be deposited by a suitable printing method. These may include dye diffusion thermal transfer, wax thermal transfer, indirect dye diffusion thermal transfer, screen printing, inkjet printing or a gravure printing process such as pad printing. In some embodiments, the intermediate layer is deposited by printing. In some embodiments, the intermediate layer is deposited by pad printing.

The method of the present invention may additionally include the step of applying a hard-coat layer to at least a portion of the substrate prior to applying the decorative layer, the intermediate layer and/or the sublayer. Specifically, the hard-coat layer can be applied to the second surface of the substrate (being the surface upon which the decorative layer is applied) and should cover at least the portion of the substrate upon which a portion of the decorative layer is to be applied. The hard-coat layer thereby provides an interface between the substrate and at least a portion of the decorative layer, the intermediate layer and/or the sublayer. This interface can assist in binding the decorative layer, the intermediate layer and/or the sublayer to the substrate, or may assist in controlling the residual stress of the decorative layer and/or the rates of thermal expansion of the decorative layer or the substrate. Alternatively, the hard-coat layer may cover a majority, or substantially the entire second surface of the substrate prior to the application of the decorative layer.

In view of the above, it is to be understood that (unless expressly stated otherwise) reference to the deposition of the decorative layer, or intermediate layer and/or sublayer, to the second surface of the radio-transmissive substrate encompasses deposition onto a coating, layer or film previously deposited onto the second surface of the radio-transmissive substrate, such as a hard-coating.

Further, the method of the invention may include applying a hard-coat to the first surface of the substrate. Such a hard-coat will act as a protective layer between the external environment and the substrate reducing physical and chemical damage.

In some embodiments, the hard-coat (applied to the second surface of the substrate and/or on the first surface of the substrate) is at least 6 μm thick and/or has a maximum thickness of 28 μm thick. In some embodiments, the hard-coat comprising by applying one or more abrasion resistant layers comprising a material selected from the group consisting of an organo-silicon, an acrylic, a urethane, melamine and an amorphous SiOxCyHz.

The present invention further provides a decorative radome comprising: a first layer comprising a radio-transmissive polymer, the first layer having a front surface; a second layer comprising a radio-transmissive polymer, the second layer having a rear surface; and a decorative layer, between the first and second layer, comprising a layer of metal or an alloy comprising a metal and a metalloid, wherein the second layer directly abuts the decorative layer and the second layer is directly adhesion bound to the first layer, and wherein at least one of the first or second layers is comprised of a polymer capable of being overmolded at a barrel nozzle temperature at, or below, 300 degrees Celsius.

Higher barrel temperatures during overmolding result in an increased temperature of the second-shot polymer. Consequently, there is a greater change in the radio-transmissive substrate (which is being overmolded) and any deposited decorative layer. This leads to greater thermal expansion and more rapid thermal expansion of the radio-transmissive substrate and deposited decorative layer, which can damage the decorative layer. Hence, a lower barrel nozzle temperature is advantageous and desirable.

The decorative radome of the present invention can be produced using the method described above, or another suitable method which produces the required features. Further, embodiments of the decorative radome should be interpreted as including the limitations described above as they relate to at least the substrate and the overmolded layer (being the first and second layer of the radome), and the composition and physical characteristics of the decorative layer. For example, the above description of desirable compositions of the metal and metalloid/metal alloys, the desired reflective properties and/or the desirable thicknesses should be considered as representing possible embodiments of the decorative radome of the invention.

Further, the decorative radome can be provided with additional layers as described above. For clarity, in some embodiments the decorative radome includes a hard-coat layer on the front surface of the first layer. Further in some embodiments the decorative radome includes a hard-coat layer between at least a portion of the first layer and the decorative layer.

Further, the decorative radome can be provided with an intermediate layer positioned between the first and second layer. The intermediate layer can play a decorative role and provide colour to the decorative radome. Therefore, in some embodiments, the intermediate layer is coloured. The intermediate layer might fulfil alternatively or in parallel further functions. For example the intermediate layer might provide a lighting for and/or illumination of the radome, preferably of the visual feature, the decorative elements and/or the logo. Alternatively or in addition the intermediate layer might provide a heating function to remove mist, water, ice or the like from a surface of the radome.

The intermediate layer might a comprise a plurality of sublayers. Each of the sublayers might provide different functions, preferably one of the before described functions. Also a combination of sublayers might provide at least one function or a combination of such functions. Further, in at least some embodiments, the intermediate layer or the sublayer is not substantially overlaid, or not overlaid, with the decorative layer. Such masking can be utilised when shadow masking during the deposition of the decorative layer is difficult, or the appropriate details cannot be achieved solely by shadow masking. The intermediate layer and/or sublayer may be any suitable layer, and in a preferred embodiment the intermediate layer is an ink, dye, oil, wax, lubricant or other suitable liquid. In a preferred embodiment, the intermediate layer is an ink.

In a preferred embodiment the substrate layer is used as a light guide or light pipe to illuminate the badge. To fulfil this function the radar unit is located on the side of the first or front surface. This allows to locate a light source or light engine outside the field of view of the radar unit so that the transmission of radiation through the radome from and to the radar unit is not negatively influenced.

Furthermore difficulties in combining illumination and radar functionality into a radome used as a badge and emblem are overcome by using the substrate as light pipe. In this way no further additional elements within the radome are necessary. Thus it is easier to reach a uniform cross section of the radome in the field of view of the radar unit. Such a uniform cross section is preferred to provide an optimal thickness tuned according to the dielectric properties of radome. Furthermore it is avoided that elements with dissimilar materials have to be used that might lead interfaces that might interfere with the radiation of the radar unit.

Simultaneously an illumination of the radome, preferably the decorative layer and/or the visual feature is possible.

To selectively illuminate the decorative layer, preferably in the before described embodiment it is preferred that an area outside the decorative layer on the surface of the substrate is provided with at least one masking layer, especially provided by the intermediate layer or the sublayer. The masking layer might be opaque for radiation in the visual range, for example black polycarbonate so that no light fed into the substrate working as a light pipe is transmitted through the mask layer to increase the contrast to the decorative layer. Preferably it is the purpose of the masking layer to bond directly to the substrate, provide an aesthetically pleasing finish to the end user when viewed from the third surface or rear surface and act as a mask to prevent any light bleed from the light pipe. It is preferred that this masking layer has an adequate thickness to be opaque and prevent light transmission. Using polycarbonate as the same material as the substrate ensures a good bond between the substrate and masking layer. It will also provide superior performance in the field when exposed to thermal events as the properties will be very similar.

Before applying the masking layer to the substrate it is preferred that at least one cladding layer is applied to the first layer or substrate, preferably in the area outside the decorative layer. The cladding layer is preferably comprising a lower refractive index material or reflective material to further ensure that no light is transmitted through the masking layer. The purpose of the optional cladding layer is to prevent the loss of light from being absorbed by the masking layer. To do this the cladding layer can comprise a material having reflective white characteristics, like a colour resin, that reflects a majority of incident light or can comprise a transparent material, like a resin, with a lower refractive index then the substrate. In the latter case it will behave like the cladding on an optical fibre and follow the same optical rules/constraints.

It is especially preferred that this layer comprises a white reflective polycarbonate to ensure a robust bond during the overmolding process to the masking layer. Using polycarbonate will ensure good field performance to thermal events.

In this embodiment it is furthermore preferred that the decorative layer is applied to an elevated portion, preferably projection, of the substrate before a cover is applied to the substrate, the decorative layer and/or the mask layer formed by the second layer or overmolded layer.

In this specific embodiment as the substrate is facing the radar unit is preferred that a hard coat is applied to the rear surface of the overmolded or second layer to protect this surface from outer influences.

Further, and as described above, it is desirable for the radome to have a portion, defining a radio path, which is of a uniform thickness. As such, in some embodiments, the front surface and the rear surface of the decorative radome are parallel or substantially parallel, over at least a portion defining a radio path.

The direct adhesion binding between the first layer and the second layer should be considered as excluding binding of layers using an adhesive or solvent. A reference to such a direct adhesion bond includes the bond formed when a polymer and/or multiple polymers are overmolded and interface during the overmolding process. In some embodiments, portions of the interface between the first and second layers may include, for example, an intermediate layer, sublayer and/or hard-coat layer applied to the first substrate prior to formation of the second layer. In such embodiments, the intermediate layer, sublayer and/or hard-coat layer may interface with both the first and second layer, without itself being an adhesive and/or effecting the adhesion per se.

Advantageously, the bond between the first and second layer improves the durability of the radome, compared to multipart radomes wherein the parts are held together with adhesives. As would be understood, ingress of impurities such as water between the first and second layer will lead to attenuation of radio waves traversing the radome and may additionally result in delamination of the radome. Therefore, in some embodiments there is no water ingress between the first layer and the second layer of the radome when immersed in water at 60° C. for 240 hrs.

The desired properties of the radome will be determined by the user, however in some embodiments, the radome (including radomes produced by the method disclosed herein) does not substantially attenuate electromagnetic frequencies of 10 MHz to 3000 GHz. In some embodiments, the radome has radio wave signal attenuation less than 2 dB (one way) across a signal path, or less than 1 dB (one way) across a signal path. This attenuation can be determined at any desirable radio frequency; however, in some embodiments the signal is between 24 GHZ and 79 GHz, or is 24 GHz, or 77 GHz or 79 GHz.

In some embodiments, the decorative layer when in situ on the first layer, is resistant to electrical conductivity. Therefore, in some embodiments, the decorative layer has a sheet resistivity greater than $10^6$ ohms per square ($\Omega/\square$).

The present invention also provides a vehicle including the radome of the present invention, or a radome produced by the method of the present invention. The vehicle may additionally include an antenna for transmitting and/or receiving a radio signal.

Also, before turning to a general description of the invention, and for the sake of clarity, it should be appreciated that references throughout the specification to the "first surface" or "front" of a radome or layer are references to the surface of the radome/layer which are closest to the side viewed when in situ. Conversely, a reference to the "second surface" or "rear" of the radome/layer is a reference to the surface opposite to the first surface.

BRIEF DESCRIPTION OF THE DRAWINGS

For a further understanding of the aspects and advantages of the present invention, reference should be made to the following drawings, taken in conjunction with the accompanying detailed description.

DETAILED DESCRIPTION

Radar systems in vehicles typically use microwaves to provide line-of-sight detection of objects. The three frequencies currently being used are 24 GHZ, 77 GHz and 79 GHz. Primarily, 77 GHz and 79 GHz are used in vehicles as they offer improved range and resolution compared to the 24 GHz frequency. Attenuation of radio-waves increases as the frequency increases, and therefore the microwaves used in automotive radar systems are, by design, susceptible to attenuation. This however provides a problem for radomes, as they need to form a uniform surface with minimal attenuation of the transmitted and received radio signals. Essentially, a radome needs to be transparent to microwave electromagnetic radiation, and also provide minimal refraction, while ideally being visibly opaque and attractive.

The present invention provides a method for producing a decorative radome, and a decorative radome itself, which can be used for a vehicle, which includes a decorative layer (24), but has minimal attenuation of radiowave frequencies typically used for automotive purposes, particularly the 77 GHz and the 79 GHz frequencies. Further, it is desirable that the radome meets the visual requirement and durability requirements for use as a decorative automotive badge.

Figure 1:
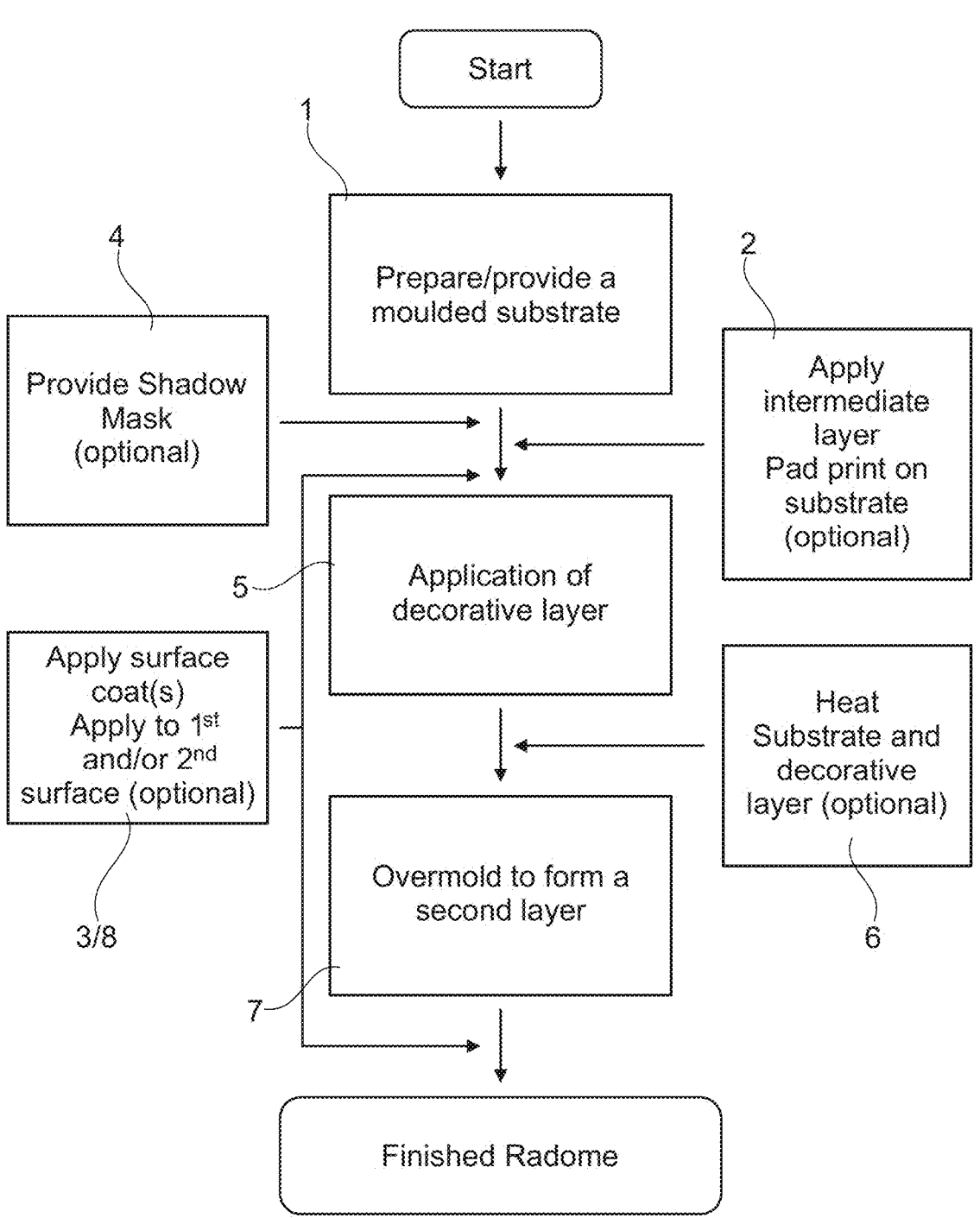
FIG. 1 is a flow diagram of an example of a method of manufacturing a radome, in accordance with the present invention.

Specifically, the method of producing a decorative radome is illustrated in FIG. 1 and includes the steps of (1) preparing or providing a (radio-transmissive) substrate. The radio transmissive substrate will have a first surface (22) and a second surface (23—see FIG. 2). The method further includes (5) applying a decorative layer (24) to a portion of the second surface (23) of the substrate (21), preferably a portion including the relieved portion (25), wherein decorative layer (24) comprising a metal or an alloy comprising a metal and a metalloid. Subsequently, the method further includes (7) overmolding at least the decorative layer (24) with a radio-transmissive polymer to provide an overmolded layer (26).

The term "second surface" as used in the context of the invention relates to a surface upon which a decorative layer (24) may be applied and which may be overmolded. The term "first surface" is used in opposition to the second surface. In one form, the radio-transmissive substrate (21) is substantially transparent when formed and will provide the front most surface of the radome, when in use. In this context the term "first surface" relates to the forward most surface of the substrate (21), when viewed. As such, and in the context of an automotive badge, the first surface (22) will be the front surface of the radio-transmissive substrate (21) of the badge when viewed from the front of the automobile.

1—Provide/Prepare Substrate

The radio-transmissive substrate (21) can be provided by any desired method. In some embodiments, the substrate (21) is injection moulded to form the desired shape. In some embodiments, the substrate (21) may be received already formed. Preferably, the substrate (21) includes a relieved portion (25) defining a three-dimensional visual feature on the second surface (23) of the substrate (21). The relieved portion (25) may be provided by a recess toward the first (22) surface of the substrate (21).

The substrate (21) and overmolded layer (26) can be formed of any suitable material, but is preferably a plastic. As would be understood in the art, radio-transmissive substrates are typically resistant to electrical conductivity (i.e. are insulating or are a dielectric). Suitable plastics and/or polymers for the substrate (21) or overmolded layer (26) include Acrylonitrile Ethylene Styrene (AES), Acrylonitrile butadiene styrene (ABS), polycarbonate (PC), high-flow AES, acrylonitrile-(ethylene-propylene-diene)-styrene (AE-PDS), blends of thermoplastics, or PC-ABS blended thermoplastic. In some embodiments, the substrate (21) will be formed of Polycarbonate.

Importantly, one of either the substrate (21), or the overmolded layer (26), is substantially transparent. This allows viewing of the decorative layer (24) through the transparent layer. Preferably, the other layer is substantially opaque to visible light. The opaque layer masks the equipment positioned behind the radome, and can modify, or improve, the visual aspects of the decorative layer (24). For example improve the colour, or reflectivity, of the decorative layer (24) by minimising light transfer through the decorative layer (24). In use, for example when a radome in accordance with the invention (such as a radome produced by the method of the invention) is fitted as a badge on a car, the transparent layer forms the outermost (forward) layer. In a preferred embodiment, the radio-transmissive substrate (21) is transparent and the overmolded layer (26) is opaque.

2—Application of Intermediate Layer

In some embodiments, the method includes the step of providing an intermediate layer (29) and/or a plurality of sublayers of the intermediate layer to at least a portion of the second surface of the radio transmissive substrate (21). In some embodiments, the intermediate layer (29) and/or sublayers is/are applied prior to the application of the decorative layer (24) and can be applied prior to, or following on from, the deposition of a second surface coating (28) (in embodiments where one is applied).

The intermediate layer (29) and/or sublayers can be used to influence the appearance of the decorative radome produced by the method of the invention or might provide further functions as described with the help of FIGS. 4 to 8 below. The intermediate layer (29) can in one embodiment be a coloured layer which applies visual colour to the decorative radome. The intermediate layer (29) may also be a masking layer (which may be removable prior to overmolding or may be clear and remain in the decorative radome once produced) that assists in preventing application of the decorative layer (24) to unwanted portions of the radio-transmissive substrate (21). In such embodiments, the intermediate layer (29) and/or the sublayer is/are not substantially overlaid, or not overlaid, with the decorative layer (24) when the radome is completed. Such masking can be utilised when shadow masking during the application of the decorative layer (24) is difficult, or the appropriate details cannot be achieved by shadow masking. In some embodiments, the intermediate layer (29) could be an oil, liquid or ink mask, for example Fomblin™, Krytox™, SpeedMask™.

In preferred embodiments, the intermediate layer (29) is applied by printing. In some embodiments, the intermediate layer can withstand temperatures at or above 150° C., 175° C., 200° C., 220° C., 250° C., 275° C. or 300° C. for a minimum of 5, 10, 20, 30, 40 or 50 seconds, or 1, 1.5 or 2 minutes.

The intermediate layer (29) may be any suitable layer, and in a preferred embodiment the intermediate layer (29) is an ink, dye, oil, wax, lubricant or other suitable liquid or coloured film. In some embodiments, the intermediate layer is an ink. The ink can be deposited by any suitable method. In some embodiments, the intermediate layer (29) is printed. Printing methods may include dye diffusion thermal transfer, wax thermal transfer, indirect dye diffusion thermal transfer, screen printing, inkjet printing or gravure printing process such as pad printing. In some embodiments, the intermediate layer (29) is applied by pad printing.

Suitable methods are known in the art for printing on radio-transmissive substrates (21). For example, a thermo-stable ink such as Norilit™ U made by Procell, Inc. can be pad printed onto a three dimensional substrate, such as the radio transmissive substrate (21), and can tolerate temperatures up to 220° C. for more than two minutes. Other suitable inks and printing methods are known in the art, and can be used in the invention disclosed herein.

3—Apply Second Surface Coating (Optional)

In some embodiments, the method includes the further step of providing at least a portion of the second surface (23) of the radio-transmissive substrate (21) with a hard-coat (28). In such embodiments, the application of a hard-coat to at least a portion of the second surface (23) of the radio-transmissive substrate (21) may provide advantageous functions, including (but not limited to): increasing or influencing the bonding between the decorative layer (24) and/or intermediate layer (29) with the radio transmissive substrate (21); controlling the residual stress and/or thermal expansion of the decorative layer (24); tuning the colour, reflectivity or other visual appearance of the decorative layer (24) and/or intermediate layer (29); and/or providing an interface between portions of the radio-transmissive substrate (21) and the overmolded second layer (26) thereby influencing the adhesion bond between the two (without been an adhesive layer).

Suitable hard-coat layers (28) are described below under heading 7 "Applying Surface Coating(s)".

4—Providing Shadow-Masking

Methods for applying decorative layers (24), such as physical vapour deposition (PVD), typically require masking to ensure that deposition of the material forming the decorative layer (24) is selectively applied to the radio-transmissive substrate (21). As such, the method of the present invention may include the step of (4) providing a shadow mask. The shadow mask facilitates selective application of decorative layer (24) on the radio-transmissive substrate (21). The type of shadow mask used will depend on the technique used to apply the decorative layer (24). In some embodiments, the shadow mask is compatible with PVD, in particular sputtering and evaporation. In some embodiments, the shadow mask is stainless steel.

The shadow mask can be attached to each radio-transmissive substrate (21) prior to application of the decorative layer (24) or can be positioned within the deposition machine, such as on the target side of a PVD machine.

5—Application of Decorative Layer

The decorative layer (24) is applied only to a portion of the second surface (23) of the substrate (21) to provide a visual feature on the radio-transmissive substrate (21). In some embodiments, having a relieved portion (25) in the radio-transmissive substrate (21), the decorative layer (24) is applied to the relieved portion (25).

By applying the decorative layer (24) to only a portion of the substrate (21), this allows direct adhesion bonding between the first (radio-transmissive substrate) layer (21) and the (second) overmolded layer (26) in portions not provided with the decorative layer (24). In the absence of this direct adhesion binding between the substrate (21) and the overmolded layer (26), the layers may separate.

The decorative layer (24) is preferably a reflective layer, and includes any suitable metal, metalloid or metal/metalloid alloy that provides the desired reflectivity, or decorative appearance while being radio-transmissive. In some embodiments the metal which forms the decorative layer (24) includes transition metals. In some embodiments, the metal which forms the decorative layer (24) is Indium or Tin.

In some embodiments, a reflective layer is abutted by additional layers. In one embodiment, the reflective layer is between two layers of deposited Silicon. These multilayer stacks allow for tuning of the layer, including its colour and residual stress. In some embodiments, multiple layers, including a layer of Silicon followed by a layer of Aluminium/Silicon and then a further layer of Silicon, are deposited to the substrate (21) to form the decorative layer (24) prior to overmolding.

The importance of residual stress, the use of interfacing layers in controlling residual stress, and determination of residual stress parameters are described in WO2011/075796 and U.S. Pat. No. 9,176,256 B2, each entitled "PLASTIC AUTOMOTIVE MIRRORS", and each of which is hereby incorporated by reference in its entirety for all purposes.

In some preferred embodiments, the decorative layer (24) includes a metalloid. Metalloids include Silicon, Boron, Germanium, Arsenic, Antimony and/or Tellurium. In specifically preferred embodiments, the metalloid is Silicon or Germanium. In a most preferred embodiment the metalloid is Germanium. Suitable metalloid/metal alloys include: Germanium and Aluminium and, optionally, Silicon; or Germanium and Silicon; or Germanium and Silver and, optionally, Silicon; or Germanium and Indium and, optionally, Silicon; or Aluminium and Silicon. In some embodiments, the alloy of Germanium is Germanium and Aluminium, or Germanium and Silicon, or Germanium and Aluminium and Silicon. In some embodiments, the alloy is Silicon and Aluminium.

When the metalloid/metal alloy includes Germanium, the alloy is at least 25 wt % germanium, or at least 40 wt % germanium, or at least 45 wt % germanium, or at least 50 wt % germanium, or at least 55 wt % germanium.

The decorative layer (24) is provided as a thin-coating layer. In some embodiments, the average thickness of the decorative layer (24) is 20-190 nm thick, or 40 to 170 nm thick, or 60 to 150 nm thick. Such thin-coatings can be provided by multiple methods in the art. However, preferably, the decorative layer (24), preferably a thin coating forming the decorative layer (24), is deposited by Physical Vapour Deposition (PVD). Suitable PVD methods include magnetron sputtering and evaporation, which may be resistive thermal evaporation or electron-beam evaporation. In some embodiments, the decorative layer (24) is deposited by magnetron sputtering.

Ideally, the moulding of the radio-transmissive substrate (21) (in embodiments whereby the radio-transmissive substrate is moulded), the application of any intermediate layers (29), and the application of the decorative layer (24) are performed in the same machine.

Alternatively, each step can be performed by separate machines arranged to operate sequentially.

6—Heating Substrate and Decorative Layer

Prior to providing a second-shot overmolded layer (26), it may be advantageous to heat the substrate (21) and the decorative layer (24). Such heating (6) permits a degree of thermal expansion at a rate slower than that which will be encountered during the overmolding process (7) and as such will limit the rate of change in temperature of the decorative layer (24), and the substrate (21), during overmolding. This reduces visual defects, such as crazing, during the overmolding step (7). Therefore, in some embodiments of the method of invention, the substrate (21) and the decorative layer (24) are heated prior to overmolding. In some embodiments, the substrate (21) and the decorative layer (24) are heated to at least 70° C., or to at least 80° C. prior to the overmolding step (7).

7—Overmolded Layer

The overmolded layer (26), once set, provides a third (rear) surface (27) which is parallel or substantially parallel, to the first surface (22) of the radio-transmissive substrate (21), over at least a portion of the radome. The parallel or substantially parallel portion defining a radio path through which radio waves can traverse. Importantly, the parallel or substantially parallel nature of the first and third surface minimise difference in the refraction of the radio waves as they traverse different portions of the radio path of the radome.

Different thermoplastics/thermo-polymers have different flow temperatures and therefore require different barrel nozzles for injection moulding. Typically, higher temperatures will increase the likelihood of damage and visible defects in the decorative layer (24) when overmolded. Therefore, it is preferable to use thermoplastics/thermo-polymers with a relatively low nozzle temperature, or a nozzle temperature below the crazing point of the decorative layer (24).

The melt temperature and mould temperature for a range of common thermoplastics is provided in Table 1 below.

TABLE 1

Thermoplatics melt temperatures and desired mould temperatures.

| | MELT TEMPERATURE RANGE (° C.) | MOULD TEMPERATURE RANGE (° C.) |
|---|---|---|
| ABS | 190-270 | 40-80 |
| ABS/PC ALLOY | 245-265 | 40-80 |
| ACETAL | 180-210 | 50-120 |
| AES | 215-260 | 55-65 |
| PMMA | 220-250 | 50-80 |
| CAB | 170-240 | 40-50 |
| HDPE | 210-270 | 20-60 |
| LDPE | 180-240 | 20-60 |
| NYLON 6 | 230-290 | 40-90 |
| NYLON 6 (260% GF) | 250-290 | 50-90 |
| NYLON 6/6 | 270-300 | 40-90 |
| NYLON 6/6 (263% GF) | 280-300 | 40-90 |
| NYLON 11 | 220-250 | 40-110 |
| NYLON 12 | 190-200 | 40-110 |
| PEEK | 350-390 | 120-160 |
| POLYCARBONATE | 280-320 | 85-120 |
| POLYESTER PBT | 240-275 | 60-90 |
| PET (SEMI CRYSTALLINE) | 260-280 | 20-30 |

TABLE 1-continued

Thermoplatics melt temperatures and desired mould temperatures.

| | MELT TEMPERATURE RANGE (° C.) | MOULD TEMPERATURE RANGE (° C.) |
|---|---|---|
| PET (AMORPHOUS) | 260-280 | 20-30 |
| POLYPROPYLENE (COPOLYMER) | 200-280 | 30-80 |
| POLYPROPYLENE (HOMOPOLYMER) | 200-280 | 30-80 |
| POLYPROPYLENE (260% TALC FILLED) | 240-290 | 30-50 |
| POLYPROPYLENE (260% GF) | 250-290 | 40-80 |
| POLYSTYRENE | 170-280 | 30-60 |
| POLYSTYRENE (260% GF) | 250-290 | 40-80 |
| PVC P | 170-190 | 20-40 |
| PVC U | 160-210 | 20-60 |
| SAN | 200-260 | 50-85 |
| SAN (260% GF) | 250-270 | 50-70 |
| TPE | 260-320 | 40-70 |

Further specifications for thermoplastic materials are provided by the International Organisation for Standardization, and are particularly set forth in the Standards Catalogue 83.080.20.

In some embodiments, the overmolded layer (26) is formed with a barrel nozzle temperature at or below 300° C. In some embodiments, the barrel nozzle is at or below 280° C. during the overmolding process (7). In some embodiments, the barrel nozzle is at or below 250° C. during the overmolding process (7). In some embodiments, the barrel nozzle is at or below 230° C. during the overmolding process (7). Suitable polymers, which are capable of being injection moulded at these barrel nozzle temperatures are known in the art and are determined by their melt temperature.

8—Applying Surface Coating(s)

Further, some embodiments of the method of the invention include providing the first surface (22) of the radio-transmissive substrate (21) with a hard-coat (28). The inherent function of a radome is to provide protection to radar equipment from the environment. As such, the radome is susceptible to degradation, wear and damage. This exposure is further amplified when the radome is positioned at the front of a vehicle that is routinely exposed to relatively high speeds, abrasives, projectiles as well as chemicals used for cleaning. In this respect, a coating (28) that is said to be a "hard-coating" is a coating that is harder than the radio-transmissive substrate (21), whereby it increases the abrasion resistance of that radio-transmissive substrate (21).

Such an abrasion resistant hard-coating (28) is one that reduces damage due to impacts and scratching. Abrasion resistance can be measured through standard tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steelwool Test.

Furthermore, some plastics can be damaged by certain solvents; for example, polycarbonate is damaged by acetone. It is a requirement for many exterior automotive components, such as radomes, that they be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hard-coating ideally provides at least the first surface of the radome with such chemical resistance.

A hard-coating (28) on the first (22) and/or second (23) surface of the radome and/or radio-transmissive substrate is preferably formed from one or more abrasion resistant layers, and may include a primer layer that bonds well to the substrate (21) and forms a preferable material and/or surface for subsequent abrasion resistant layers. The primer layer may be provided by any suitable material and may for example be an organic resin such as an acrylic polymer, a copolymer of acrylic monomer and methacryloxysilane, or a copolymer of a methacrylic monomer and an acrylic monomer having a benzotriazole group or benzophenone group. These organic resins may be used alone or in combinations of two or more.

The hard-coat layer(s) (28) are preferably formed from one or more materials selected from the group consisting of an organo-silicon, an acrylic, a urethane, a melamine or an amorphous $SiO_xC_yH_z$.

Commercially available hard-coatings include Momentive PHC-587B, momentive UVHC 5000 (which is UV cured) and the two part product comprising a primer of PR6600 (SDC Technologies), subsequently coated with MP101 (SDC Technologies).

Most preferably, the hard-coat layer(s) (28) is/are an organo-silicon layer, due to its superior abrasion resistance and compatibility with physical vapour deposited films. For example, a hard-coating layer comprising an organo-silicon polymer can be formed of a compound selected from the following compounds: trialkoxysilanes or triacyloxysilanes such as, methyltrimethoxysilane, methyltrichoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltriacetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy) propyltrimethoxysilane, beta-(26,4-epoxycyclohexyl)ethyltrimethoxysilane, beta-(26,4-epoxycyclohexyl)ethyltriethoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminoethyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldiethoxysilane, methylvinyldimethoxysilane, methylvinyldiethoxysilane and the like.

The hard-coat layer(s) (28) may be coated onto a substrate (such as the radio-transmissive substrate (21)) by dip coating in liquid followed by solvent evaporation, or by plasma enhanced chemical vapour deposition (PECVD) via a suitable monomer, flow coating or spray coating. To improve the abrasion resistance of the hard-coating (28), subsequent coatings of the hard-coating may be added, preferably within a 48 hour period to as to avoid aging and contamination of the earlier coatings. These additional coatings may be added to either the first (22) or second (23) surface of the substrate (21).

The thickness of the hard-coat layer (28) is preferably selected to assist in providing adequate abrasion resistance. The appropriate abrasion resistance will be determined by the required application and the demands of the user. In some applications, adequate abrasion resistance may be regarded as being a Bayer abrasion ratio of 5 with respect to an uncoated plastic substrate (21—such as a polycarbonate), or alternatively by a Taber abrasion test with delta haze less than 15% after testing with a 500 g load and CS10F wheel at 500 cycles, (% haze being measured as per ASTM D1003). With these requirements met, when an organo-silicon is used as a hard-coat layer (28), the thickness of the hard-coating (28) is preferably at minimum of at least 6 μm thick on average and/or has a maximum thickness of 28 μm thick.

Further coatings to those discussed above may be applied to the first surface of the radio-transmissive substrate, in addition to those discussed above, to modify the surface properties of the substrate. For example, a cap layer may also be provided by materials having characteristics, including: hydrophobic, hydrophilic, lipophobic, lipophilic and oleophobic or combinations thereof.

Decorative Radome

The invention further provides a decorative radome comprising; a first layer (21) comprising a radio-transmissive polymer, the first layer (21) having a front surface (22); a second layer (26) comprising a radio-transmissive polymer, the second layer (26) having a rear surface (27); and a decorative layer (24) between the first (21) and second (26) layer comprising a metal or an alloy comprising a metal and a metalloid, wherein the second layer (26) directly abuts the decorative layer (24) and the first layer (21) is directly adhesion bound to the second layer (26), and wherein at least one of the first (21) or second (26) layers is comprised of a polymer (thermo-polymer) capable of being overmolded at a barrel nozzle temperature below 300 degrees Celsius.

Further, the decorative radome of the invention can include a hard-coat (28) provided to the first surface (22) of the radome.

It is to be understood that the term "directly adhesion bound" is a reference to the physico-chemical phenomenon resulting from molecular attraction exerted between the first layer (21) in contact with the second layer (26), and is expressly considered to exclude bonds formed solely by adhesives.

The decorative radome of the invention does not substantially attenuate electromagnetic frequencies of 10 MHz to 3000 GHz. Specifically, in some embodiments, the radome has a radar attenuation less than 2 dB one-way (4 dB two-way) across a signal path, or preferably 1 dB one-way (2 dB two-way) across a signal path. Further, the decorative layer (24) comprising a metal or an alloy of metal and a metalloid, has a sheet resistivity greater than $10^6$ ohms per square (Ω/□).

Advantageously, the direct adhesion bond formed between the first layer (21) and the second layer (26) improves the weather resistance of the radome compared to radomes formed of layers bound by adhesives. Therefore, in some embodiments there is no water ingress between the first layer (21) and the second layer (24) when immersed in water at 60° C. for 240 hrs.

The decorative radome can be produced in accordance with the method disclosed above. Alternatively, the decorative radome can be produced by any suitable method that provides all of the required claimed features and functions. Importantly, the decorative radome of the invention should be considered to optionally include, the structural and functional features disclosed above in relation to the method.

The decorative radome of the present invention, or produced with the method of the present invention, can be used in any suitable context. In an embodiment the radome is a car badge. In some forms, the car badge may include additional features, functions and aesthetics. In some embodiments, the radome can be used in combination with a light assembly, or may include additional features, as that described in WO2017/009260 and US patent application publication number 2018/0202626 A1, each entitled "A LIGHT ASSEMBLY AND A VEHICLE DESIGN ELEMENT INCLUDING SUCH A LIGHT ASSEMBLY", and each of which is hereby incorporated by reference in its entirety for all purposes.

Figure 3:
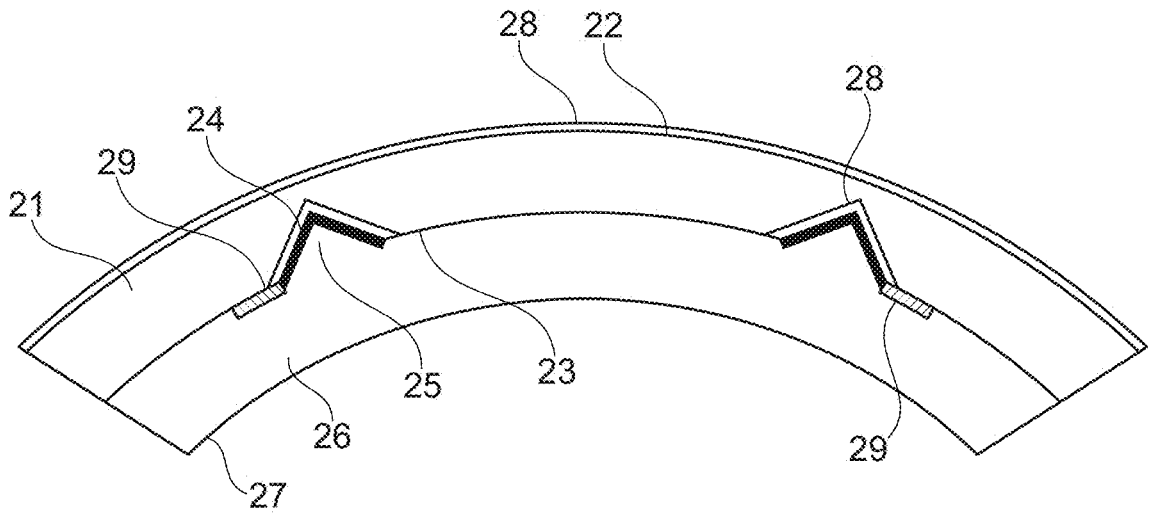
FIG. 3 is a cross-section of an example of a radome in accordance with the present invention including an intermediate layer, preferably playing a decorative role.
Figure 4:
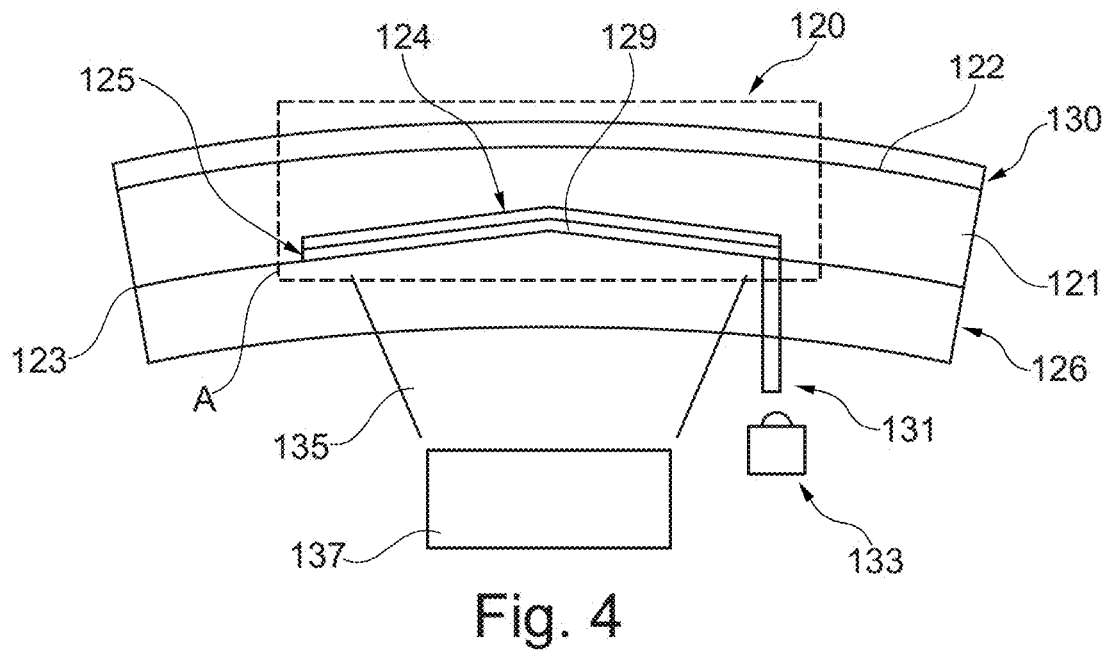
FIG. 4 is a cross-section of an example of a radome in accordance with the present invention including an alternative intermediate layer, preferably providing lighting and/or illumination function

In FIG. 4 a cross-section of an example of a radome (120) in accordance with the present invention including an alternative intermediate layer, preferably providing lighting and/ or illumination function is shown. The radome (120) can preferably be formed by a method as described before with the help of FIG. 1. The radome (120) comprises a substrate (121). Similar to the radomes shown in FIGS. 2 and 3 the substrate (121) comprises a relieved portion (125) defining a three-dimensional additional feature on the second surface (123) of the substrate (121). Within the relieved portion (125) a decorative layer (124) similar to the decorative layer (24) described before is applied.

Figure 2:
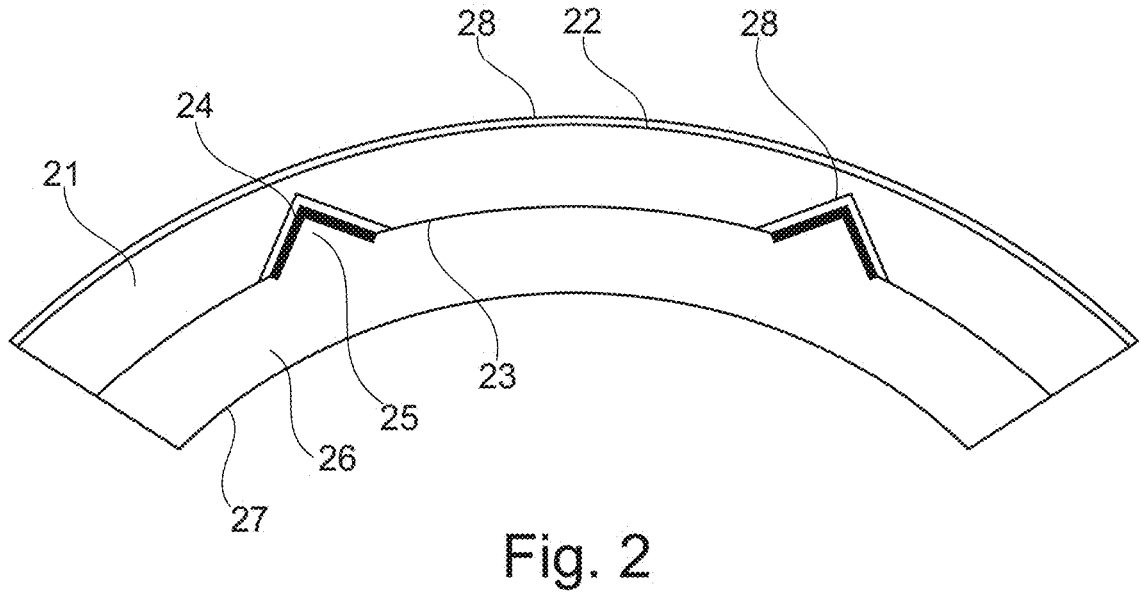
FIG. 2 is a cross-section of an example of a radome in accordance with the present invention.

In addition to the decorative layer (24) and in contrast to the radomes shown in FIGS. 2 and 3 in the radome (120) an intermediate layer (129) is located. The intermediate layer (129) is formed by a firm comprising a fibre-optic device in form of fibre-optic strings. The intermediate layer (129) is connected via a connection element in form of a light guide (131) to a light engine (133), preferably comprising an LED device. The light guide (133) is reaching through the overmolded layer (126).

The light guide (131) as well as the light engine (133) are located outside a visual field (135) of a radar unit (137). Thus radiation emitted by or transmitted to the radar unit (137) is not negatively influenced by the light guide (131) or the light engine (133).

On the first of front surface (122) of the substrate (121) a protective hard-coat (130) is applied.

Figure 5:
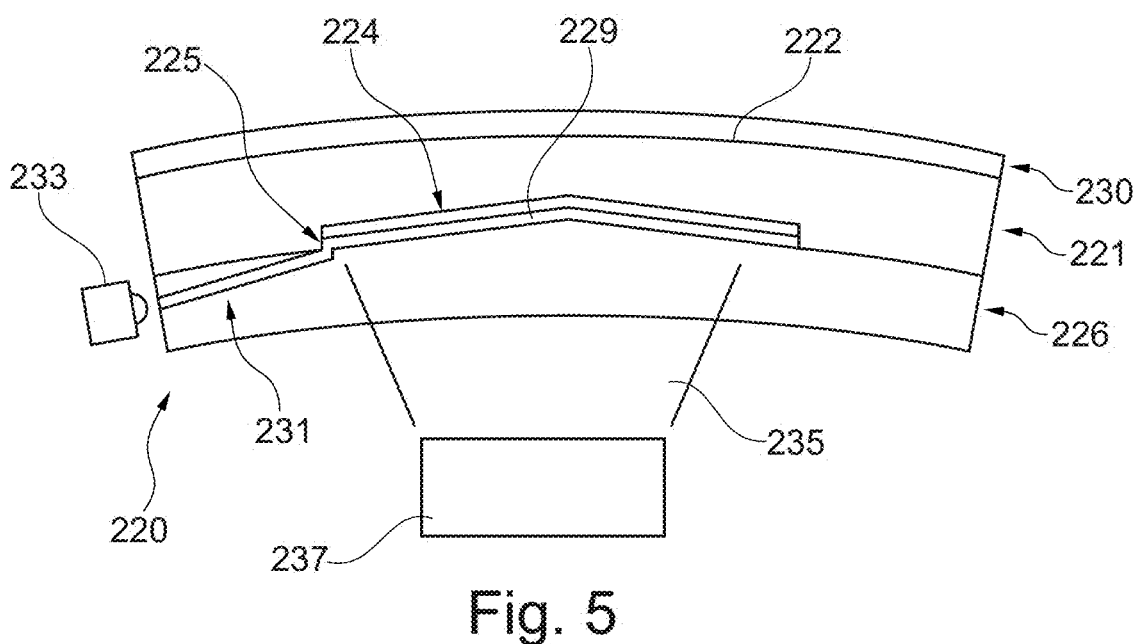
FIG. 5 is a cross-section of an example of a radome in accordance with the present invention including a further alternative intermediate layer, preferably providing lighting and/or illumination function.

In FIG. 5 a slightly different a configuration of a radome (220) is shown. The elements of the radome (220) corresponding to the elements of the radome (120) have the same reference signs, however increased by 100. The main difference between the radome (120) and the radome (220) is the location and orientation of the light engine (233) and the light guide (231). As can be seen from FIG. 5 the light engine (233) can also be located on a side surface of the radome (220). In this way the distance of the light guide (231) and the light engine (233) to the radar unit (237), preferably a view field (235) of the radar unit (237) can be further increased.

Figure 6:
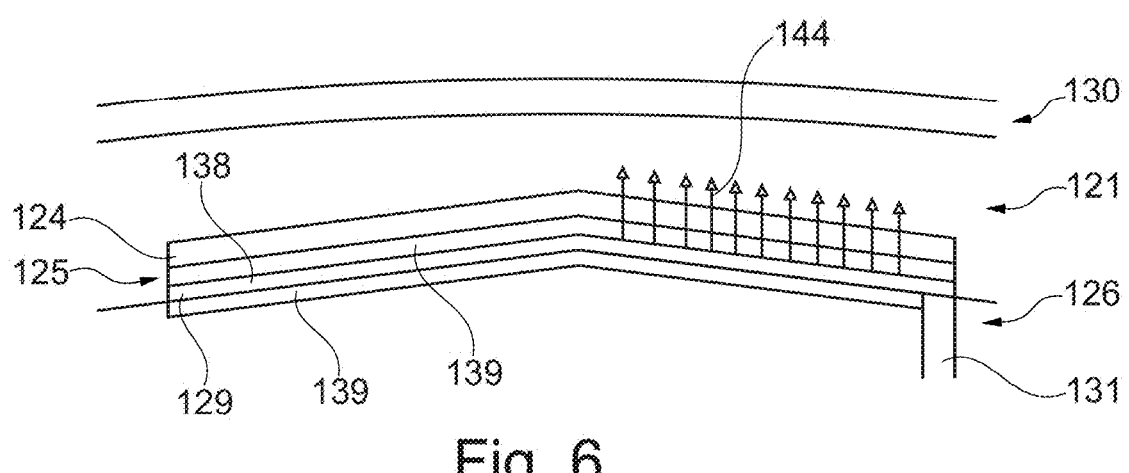
FIG. 6 is a cross section of the detail A in FIG. 5.

In FIG. 6 a cross-section of the detail A in FIG. 5 is shown. As can be taken from the FIG. 6 within the relieved portion (125) of substrate (121) the decorative layer (124) is located. On the side of the decorative layer (124) facing the overmolded layer (126) the intermediate layer (129) is located. The intermediate layer (129) comprises a sub-layer (138) including fibre-optical devices in the form of fibre-strings and thus forming a fibre optic panel. On both sides of the fibre-optic panel (138) sub-layers in form of adhesive layers (139) are located. The light guide (131) is formed by fibre-optic strings extending all of the fibre-optic panel and or be connected to the fibre-optic panel (138). The fibre-optic panel (139) might be covered by a further reflective layer on the side facing the overmolded layer (126) such that light is only emitted in the direction of the arrows (141) into the substrate (121) in the direction of the surface (122) shown in FIG. 6. Thus light produced by the light engine (133) is conveyed through the light guide (133) to the fibre-optic panel (129) and from there it is emitted through the decorative layer (124) thus illuminating the area of the decorative layer (124).

Figure 7:
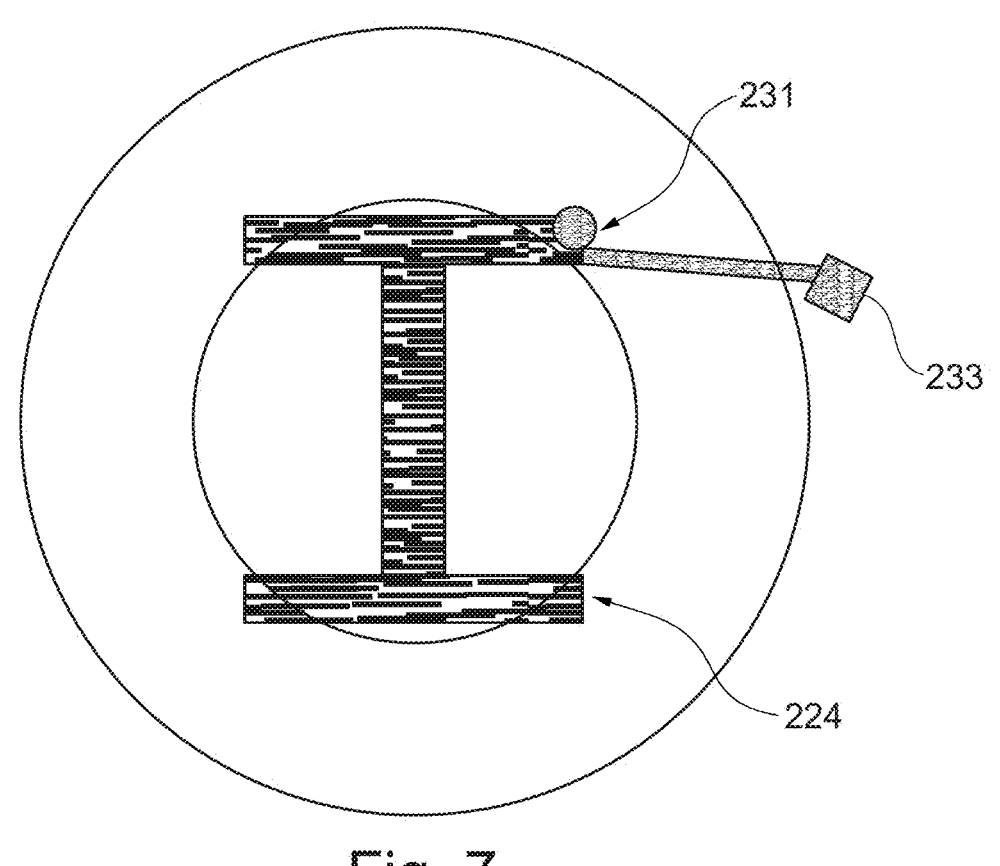
FIG. 7 is a view onto the radome of FIG. 5.

In FIG. 7 a view onto the radome (220) of FIG. 5 is shown. As can be taken from the FIG. 7 the decorative layer (224) forms a visual feature in form of the character "I". Due to the reflectivity of the decorative layer (224) the character I is reflective such that it can be seen well from the side of the radome opposite the radar unit (237). When the light engine (233) is actuated furthermore the decorative layer (224) and thus the visual feature is illuminated. It is preferred that outside the area of the relieved portion (225) an intermediate layer in form of masking is provided such that the light guide (231) as well as the light engine (233) cannot be seen from outside.

In preferred embodiments the light guide as well as the light panel allows to illuminate the visual feature selectively or in different colours depending on the colour fed into the light guide (231) by the light engine (233).

Figure 8:
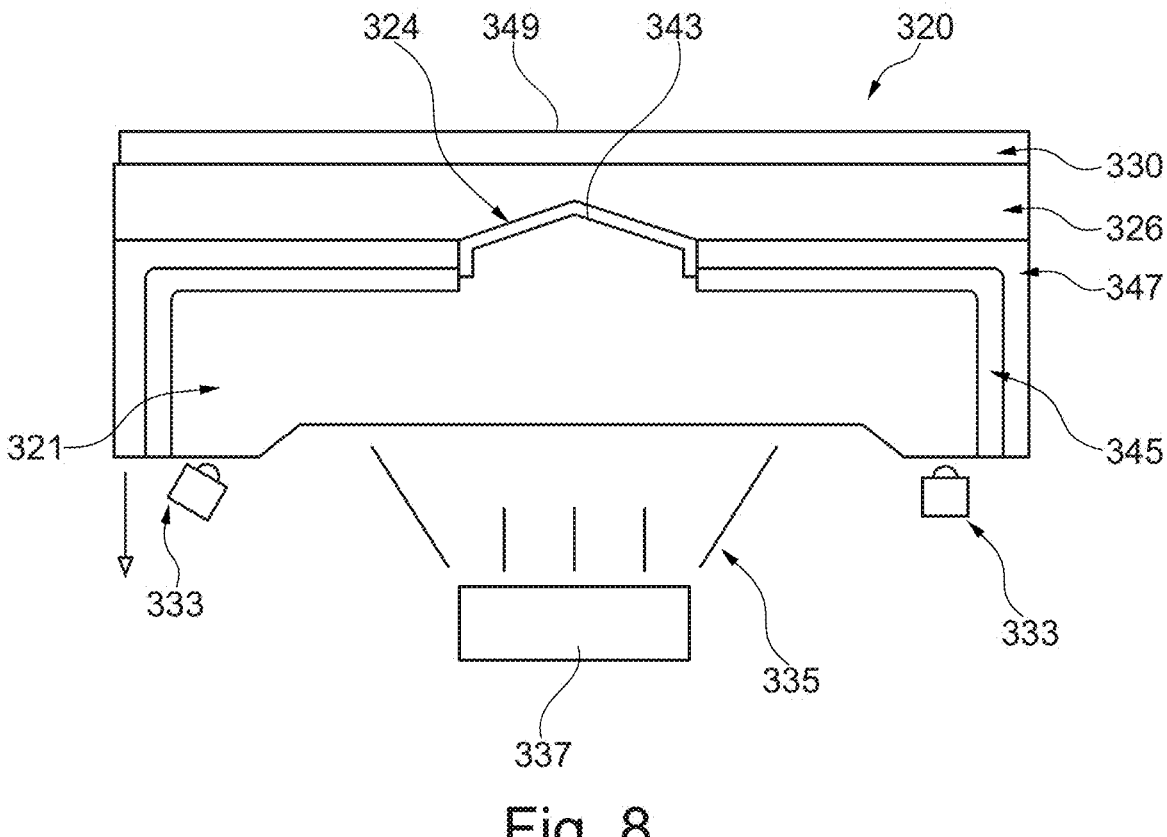
FIG. 8 is a cross section of a further example of a radome in accordance with the invention in which the substrate and first layer is used as light pipe to illuminate the radome.

FIG. 8 is a cross-sectional view of a further example of a radome (320). The elements of the radome (320) corresponding to the elements of the radome (120) have the same reference number however increased by 200. In comparison to the radomes shown in the FIGS. 2 to 7 the radome (320) is produced by an inventive method different from the method shown in FIG. 1.

The substrate (321) is produced in a first step. As can be seen from FIG. 8 the substrate (321) does not include a relieved portion but a projection (343). Before a decorative layer (324) is applied to the projection (343) a masking layer (345) is applied to the substrate outside the area of the projection (343).

In FIG. 8 furthermore before applying the masking layer (345) an optional cladding layer (347) has been applied to the substrate (321). After applying the masking layer (345) the decorative layer (324) is applied to the projection (343). In a next step the overmolded or second layer (326) is applied to the substrate (321), the masking layer (345) and the decorative layer (324). Finally an optional hard-coat (330) is applied to the overmolded layer (326).

As can be seen from a comparison of the radomes (120, 220) shown in FIGS. 4 to 7 and the radome (320) the radar unit (337) is located on the side of the radome (320) at which the substrate (321) is located. This allows to use the substrate (321) as a light pipe to illuminate the decorative layer (324).

The purpose of the light pipe is to transmit light from the light engine (333) (in FIG. 8 two light engines are shown, especially generating light of different colours, although only one light engine (333) might be used) out through the decorative layer (324) to be viewed from the surface (349) representing a rear surface or third surface in the sense of the claims. The light pipe formed by substrate (321) has entry points for light produced the light engines (333), which sit adjacent to it.

The light engines (333) are optically connected to the substrate (321). The light coupled into the substrate (321) cannot emit to the overmolded layer (326) outside the area of the decorative layer (324) due to the masking layer (345). Thus when seen from the side of the overmolded layer (326) only the decorative layer (324) is illuminated. It is preferred that the masking layer (347) and/or the cladding layer (345) covers also die surfaces of the radome to avoid emission of light through these surfaces. For this purpose the masking layer (347) and/or the cladding layer (345) might extend also beyond the radar unit (337) and the light engines (333) or might encapsulate them.

Before providing a more detailed description of various preferred embodiments of the present invention, with reference to various examples, it will be useful to provide some explanation of some of the terminology used throughout the specification, the steps of the process for producing a decorative radome and the methods and parameters for environmental testing and compliance of a radome in accordance with the present invention.

The term "reflective" refers to reflection of visible light, typically in the nanometre wave length and frequency range of 400 to 800 THz. The percentage of reflectance can be measured using known techniques in the field, or as discussed below.

A reference to radio wave throughout the specification, typically refers to frequencies of 10 MHz to 3000 GHz. In preferred embodiments, and in relation to automotive vehicles, the frequency is typically 1000 MHz to 100 GHz. In some specific embodiments in relation to radomes for vehicles, the frequency is 24 GHz to 79 GHz, or 77 GHz to 79 GHz, 24 GHZ, 77 GHZ or 79 GHZ.

The term "transparent" and "opaque" when used without a qualifier (such as "radio-wave" or "radar") refers to visually transparent or opaque, and hence is a reference to transmission or absorption of visible light as defined above.

Radome Technical Characteristics

To minimise refraction of the radar signal, as it passes through the radome, the front and rear face should be parallel or substantially parallel. Further, the interior of the radome should have no voids, air bubbles or significant changes in material density such as water ingress, and the decorative layer should be of a uniform thickness.

The surface resistivity of the decorative layer can be determined using a four-point method, using a four-point probes in accordance with JIS K7194. Surface resistivity should be above $10^6 \Omega/\square$ (Ohms per square) indicating low electrical conductivity (i.e. the reflective layer is electrically insulated in situ).

Radio wave attenuation and reflectance will be determined by the requirements of the user, the application, the frequency used and the equipment being used. However, preferably there will be a minimum of 10 dB reflection and a maximum of 1 dB one-way (2 dB two-way) transmission loss at the sensor operating frequency, typically 24 GHz, 77 GHz or 79 GHz.

Environmental Performance and Testing

The product must meet automotive exterior performance requirements such as UV resistance, abrasion resistance, resistance to temperature cycling that may case crazing or delamination of the layers forming the radome, and resistance to ingress of fluids which will lead to significant diffusion, attenuation and refraction of traversing radio signals.

Acceptable standards will be set depending on the use of the radome, and the manufactures requirements. For example, the minimal standard and testing protocols for automotive purposes will be determined by the vehicle manufacturer.

The following provides non-limiting examples of testing protocols required by automotive manufacturers:

Environmental Testing

Heat test—1 h at 90° C. —Assessment: The parts must not show any noticeable deformations 2 hours after the test at RT. There must be no visible surface changes on the part and the contact surfaces (e.g. no discoloration or cracks).

Long term aging—Test cycle 42 days at 80° C. —Assessment: as above for heat test.

Temperature cycling test—10 cycles: 2 h—30° C. —Assessment: as above for heat test.

Cold test—2 h at 40° C. —Assessment: as above for heat test.

Bucket test-Green E1 container filled with water (containing surfactant), water level at 15 cm, water temperature 20° C.±5° C. —Immerse radome in the water containing surfactant for approximately 10 minutes. Remove and dry radome-Assessment: attenuation value may not exceed. ±0.3 dB deviate from the first measurement.

Cycle test of heating—Circulating air temperature: 1 h+5° C., 1 h cooling to −5° C., 1 h at −5° C., 1 h heating to +5° C.; Air flow 30 km/h—Test duration: 700 h—Assessment: No change of surface/optics, no wire-stripping or raising of individual layers. Radar attenuation value and electrical Resistance is within specification.

Mechanical Tests

Falling weight test—1) At room temperature and −25° C., a cylindrical pin with a mass of 250 g is dropped from a drop height of ≥0.8 m at RT and ≥0.6 m at −25° C. on a rib, trim or similar protruding feature on the radome. The diameter of the bolt is at the impinging surface 15 mm—Assessment: No breakage is allowed on the surface acted on by the bolt.

Engine hood endurance run—Execution: 5000 operations of the bonnet with a falling speed of 0.6-0.7 m/s, measured 500 mm behind the engine hoodwing point-Assessment: The structural strength of the radome must be guaranteed, it may not lose or break any parts. The contact surfaces of the parts and the fasteners must not cause any damage to the surrounding parts (danger of corrosion).

Disassembly/reassembly—The disassembly/reassembly of the radome from the vehicle must be performed at room temperature three times-Assessment: The fit of the individual parts and the installation of the radome on the vehicle must be guaranteed at room temperature with uniform gap formation without deformation, sink marks and clip marks. The risk of accidents and injury must be assessed. Easy handling of the parts during assembly must be guaranteed. The clips (snap hook) cannot break out during the dismantling of the part. The holding force of the clipping of the loaded parts must withstand the loads during driving and the car wash. The contact surfaces of the parts may not cause damage or discoloration on surrounding parts.

High pressure cleaning test—The test must be carried out in 2 different cleaning systems. Distance: approx. 50-100 mm. Test duration: 30 sec—Assessment: There must be no damage to the component and the surface. No change in the attenuation values.

Visual Characteristics

The visual characteristics and tolerable parameters will be dependent on the application of the radome and user requirements.

When the radome is developed for automotive applications the following considerations should be applied. The border between the reflective and non-reflective surfaces must be visually smooth and crisp. The reflectivity should match that of metal finishes, particularly associated metallic finishes in proximity to the radome.

The reflectivity should minimally be 35%, or more preferable greater than 45%. The colour space will be determined by the user, but preferably has the colour coordinates on L a b colour space of $-1<a<1$, $-1<b<1$ (1st surface & 2nd surface viewing). The reflectivity can be assessed on the basis of first surface viewing (i.e. viewing with the surface of application proximal to the testing apparatus or the "viewer"). Alternatively, reflectivity can be assessed on the basis of second surface viewing (i.e. viewing through a material with the surface of application of the decorative layer distal to the testing apparatus or the "viewer"). The terms "first surface viewing" and "second surface viewing" are not the be confused with reference to applications of coatings to the "first surface" or "second surface" as used and defined herein in relation to the method of producing a radome in accordance with the invention, or the radome per se.

Reflectivity can be measure using known techniques in the art including using the CIELAB colour scale, illuminate A, observer at 2 degrees.

Methods of producing a radome in accordance with the invention are describe by way of the following examples.

Example 1—Germanium/Aluminium Reflective Layer

Substrate Preparation

A polycarbonate substrate, formed by injection moulding was cleaned with a commercial ultrasonic cleaning system in the presence of a detergent. The cleaned substrate was rinsed in distilled water in a clean (dust free) environment, to provided substantially contamination free substrate.

The substrate is moulded to provide a relieved portion on the second surface to provide a visual feature, which may be subsequently coated as described below.

First Surface Hard-coating

The clean substrate was spray-coated on the first surface with Momentive PHC-587B in solution. The first-surface coated substrate was left for 10 minutes to allow evaporation of the solvents until the surface was substantially tack-free. Subsequently, the first-surface coated substrate was cured for 45 minutes at 130° C. in a curing oven to provide a hard-coated substrate.

To avoid ageing and/or contamination of the substrate, the coated article was further processed as detailed below within 48 hours.

Second Surface Reflective Layer

A reflective layer was provided to the second surface of the substrate using the following process.

The hard-coated substrate was blown down with deionised air, selective shadow masks were applied to limit the area of deposition of subsequent coatings, and then the masked substrate was loaded into the coating sample chamber of a batch type vacuum chamber.

The sample chamber was evacuated to $1.5 \times 10^{-5}$ mbar and the second surface of the substrate was coated with a reflective coating as detailed below.

The following were deposition conditions:

Reflective layer—Target: Aluminium/Germanium (50 wt %)

Argon: 400 sccm

Pressure: $2.2 \, e^{-3}$ mbar

Power: 30 kW

Target to substrate distance: =110 mm

Deposition time: 2 minutes

Layer thickness: 70 nm

Overmolding of the Substrate

The second surface of the substrate, having a provided reflective layer, was overmolded with a second radio-transmissive polymer to provide an overmolded layer, using the protocol detailed below.

The coated substrate was loaded into a holding oven maintained at 75° C. for a minimum of 5 minutes to increase the temperature of both the substrate and the provided layer(s).

The heated substrate was then loaded into the second-shot injection mould tool. An overmolded layer was provided by a second shot injection of opaque Acrylonitrile Ethylene Styrene (AES) onto the second surface of the substrate, at a barrel temperature of 225° C. This overmolded layer covered the reflective layer on the substrate and the uncoated second surface of the substrate, thereby encapsulating the coating, to provide the decorative radome.

Assessment of the Radome

Environmental and Visual performance of the radome was assessed using the following techniques.

Humidity Ageing:

Place the radome into environmental chamber at 40° C. and 95% relative humidity for a period of 1000 h.

Thermal Shock:

Subject the radome to 200 cycles of −40° C. to +85° C. at the rate of 1 h/cycle with a change period of <30 s.

Thermal Cycle:

Subjected the radome to 10 cycles of; 75°±2° C. for 4 h; to 38°±2° C., 95%±5% relative humidity for 16 h; to −30°±2° C. for 4 h.

Cold Temperature Ageing:

Place the radome into a freezer at −40° C. for a period of 240 h

High temperature Ageing:

Place the radome in an oven, ageing conditions: 80±2° C. for 1000 h

The result are provided in Table 2, below:

TABLE 2

| Results | |
| --- | --- |
| Description | Result |
| Photopic reflectivity 2nd surface viewing | 50% |
| Appearance | Coating free of defects |
| One way radar attenuation 76-77 GHz | <2 dB |
| Humidity Ageing (40° C., 95% RH, 500 hrs) | Pass |
| Thermal Shock | Pass |
| Thermal Cycle | Pass |
| Cold Temperature ageing | Pass |
| High Temperature ageing (80° C., 500 hrs) | Pass |

Example 2—Aluminium/Silicon Reflective Layer

Substrate Preparation and Hard-Coating

An injection moulded polycarbonate substrate was prepared and provided with a first surface hard-coat as describe above in Example 1, with the exception that the substrate was selectively dip coated on the first surface and portions of the second surface using a mask, such that the portion of the second surface designated for deposition of the reflective layer are provided with a hard-coat.

Second Surface Reflective Layer

The hard-coated substrate was prepared for coating with a reflective layer as described in Example 1. The reflective layer was deposited using the following conditions:

Reflective layer-Target: Aluminium/Silicon (60:40 wt %)
Argon @ 20 sccm
Pressure=4 e$^{-3}$ mbar.
Power @ 700 W
Target to substrate distance=110 mm
Deposition time=13 minutes
Thickness=50 nm Overmolding of the Substrate The second surface of the substrate, having a provided reflective layer, was overmolded with a second radio-transmissive polymer to provide an overmolded layer, using the protocol detailed below.

The coated substrate was loaded into a holding oven maintained at 80° C. for a minimum of 5 minutes to increase the temperature of both the substrate and the provided layer(s).

The heated substrate was then loaded into the second-shot injection mould tool. An overmolded layer was provided by a second shot injection of opaque Acrylonitrile Butadiene Styrene (ABS) onto the second surface of the substrate, at a barrel temperature of 245° C. This overmolded layer covered the reflective layer on the substrate and the uncoated second surface of the substrate, thereby encapsulating the coating, to provide the decorative radome.

Assessment of the Radome

Environmental and Visual performance of the radome was assessed using the techniques described above, with the following result:

TABLE 3

| Results | |
| --- | --- |
| Description | Result |
| Photopic reflectivity 2$^{nd}$ surface viewing | 42% |
| Appearance | Coating free of defects |
| One way radar attenuation 76-77 GHz | <2 dB |
| Humidity Ageing (40° C., 95% RH, 500 hrs) | Pass |
| Thermal Shock | Pass |
| Thermal Cycle | Pass |
| Cold Temperature ageing | Pass |
| High Temperature ageing (80° C., 500 hrs) | Pass |

Example 3—Decorative Layer Comprising Multiple Layers

Substrate Preparation and Hard-Coating

An injection moulded polycarbonate substrate was prepared as describe above for Example 1. A hard-coat was provided by first priming the first surface by spray coating with PR6600 (SDC Technologies). After 10 minutes of evaporation, the primed first surface was subsequently spray coated with MP101 (SDC Technologies) to form a hard-coat.

The hard-coated substrate was then moved to a curing oven for 60 minutes at 130° C.

Subsequent coatings are performed within a 48 hour period so as to avoid ageing/contamination of the parts surfaces.

The substrate was blown down with deionised air and then loaded into a batch type vacuum chamber, which consists of a single coating chamber in which the samples are placed, evacuated and coated on the second surface directly onto the PC. Areas on the second surface are selectively masked to ensure no coating is applied.

Second Surface Reflective Layer

The hard-coated substrate was prepared for coating with a reflective layer as described for Example 1. A decorative layer including a reflective layer was deposited using the following conditions:

1$^{st}$ PVD Layer
Dual rotatable Target: Silicon (99.9 wt %)
Argon @ 160 sccm
Oxygen @ 302 sccm
Pressure=2 e$^{-3}$ mbar
Power @ 35 kW @ 27 kHz
Target to substrate distance=110 mm
Deposition time=4 minutes
Thickness=250 nm 2$^{nd}$ PVD Layer
2nd PVD layer—reflective—Target: Aluminium/Germanium (50% wt)
Argon @ 400 sccm
Pressure=2.2 e$^{-3}$ mbar
Power @ 30 kW
Target to substrate distance=110 mm
Deposition time=10 minutes
Thickness=70 nm 3$^{rd}$ PVD Layer
Dual rotatable Target: Silicon (99.9 wt %)
Argon @ 96 sccm
Oxygen @ 202 sccm
Pressure=2 e$^{-3}$ mbar
Power @ 21 kW
Target to substrate distance=110 mm
Deposition time=1 minutes
Thickness=20 nm Overmolding of the Substrate The second surface of the substrate, having a provided reflective layer, was prepared for overmolding with a second radio-transmissive polymer to provide an overmolded layer, using the protocol detailed at Example 1 and an oven temperature of 75° C.

The heated substrate was then loaded into the second-shot injection mould tool. An overmolded layer was provided by a second shot injection of opaque acrylonitrile-(ethylene-propylene-diene)-styrene (AEPDS) onto the second surface of the substrate, at a barrel temperature of 220° C. This overmolded layer covered the reflective layer on the substrate and the uncoated second surface of the substrate, thereby encapsulating the coating, to provide the decorative radome.

Assessment of the Radome

Environmental and Visual performance of the radome was assessed using the techniques described above, with the following result:

TABLE 4

| Results | |
| --- | --- |
| Description | Result |
| Photopic reflectivity 2$^{nd}$ surface viewing | 49% |
| Appearance | Coating free of defects |
| One way radar attenuation 76-77 gHz | <2 dB |

TABLE 4-continued

| Results | |
|---|---|
| Description | Result |
| Humidity Ageing (40° C., 95% RH, 500 hrs) | Pass |
| Thermal Shock | Pass |
| Thermal Cycle | Pass |
| Cold Temperature ageing | Pass |
| High Temperature ageing (80° C., 500 hrs) | Pass |

Example 4—Reflective Coating of Indium (No Second Surface Hard-Coating)

Substrate Preparation and Hard-Coating

An injection moulded polycarbonate substrate was prepared and provided with a first surface hard-coat as describe above in Example 1.

Second Surface Reflective Layer

The hard-coated substrate was prepared for coating with a reflective layer as described above. The reflective layer was deposited using the following conditions:

Reflective layer-Target: Indium (99.9 wt %)
Argon @ 20 sccm
Pressure=3.6 $e^{-3}$ mbar.
Power @ 400 W
Target to substrate distance=110 mm
Deposition time=3.5 minutes
Thickness=54 nm Overmolding of the Substrate The substrate, having a provided reflective layer, was prepared for overmolding with a second radio-transmissive polymer to provide an overmolded layer, using the protocol detailed at Example 1, above.

The heated substrate was then loaded into the second-shot injection mould tool. An overmolded layer was provided by a second shot injection of opaque Acrylonitrile Ethylene Styrene (AES) onto the second surface of the substrate, at a barrel temperature of 225° C. This overmolded layer covered the reflective layer on the substrate and the uncoated second surface of the substrate, thereby encapsulating the coating, to provide the decorative radome.

Assessment of the Radome

Environmental and Visual performance of the radome was assessed using the techniques described above, with the following result:

TABLE 5

| Results | |
|---|---|
| Description | Result |
| Photopic reflectivity 2nd surface viewing | 55% |
| Appearance | Fail - Coating visually crazed |
| One way radar attenuation 76-77 gHz | <2 dB |

Example 5—Reflective Coating Across the Entirety of the Second Surface

Substrate Preparation and Hard-Coating

A polycarbonate substrate was prepared, cleaned and hard-coat was applied as described above at Example 1.

Second Surface Reflective Layer

A reflective layer was provided to the second surface as described at Example 1 above, with the exception that the second surface was not masked and the reflective layer was applied to the entirety of the second surface of the substrate.

Overmolding of the Substrate

The reflective layer covering the second surface of the substrate was overmolded in the manner described at Example 1.

Assessment of the Radome

The radome was not assessed for environmental and visual performance as the overmolded layer failed to adhere to the reflective coated substrate.

This failure indicates the need for an adhesion bond between the substrate and the overmolded layer. Consequently, the radome of the present invention does not need the provision of adhesives to bind the substrate to a second layer.

Example 6—Aluminium/Germanium Reflective Layer on a Second Surface Coating

Substrate Preparation and Hard-Coating

A polycarbonate substrate was prepared, cleaned and a hard-coat was applied as described above at Example 2. Consequently, the first surface of the substrate was provided with a hard-coat and unmasked portions of the second surface of the substrate were provided with a hard-coat. These unmasked portions include areas designed for deposition of the reflective layer.

Second Surface Reflective Layer

A reflective layer was provided to the second surface as described at Example 1 above.

Overmolding of the Substrate

The second surface of the substrate, having a provided reflective layer, was overmolded with a second radio-transmissive polymer to provide an overmolded layer, using the protocol detailed at Example 2, above.

Assessment of the Radome

Environmental and Visual performance of the radome was assessed using the techniques described above, with the following result:

TABLE 6

| Results | |
|---|---|
| Description | Result |
| Initial appearance | No defects |
| One way radar attenuation 76-77 GHz | <2 dB |
| Dry Heat 115 C. | Pass |
| High temperature ageing 1000 hr @ 80° C. | Pass |
| Humidity Ageing (40° C., 95% RH, 1000 hr) | Pass |
| constant climate test 240 hrs @ 40 C., 100 RH | Pass |
| Water immersion (240 hr @ 60° C.) | Pass |
| Thermal shock | Pass |
| Thermal cycle | Pass |
| cold temperature ageing | Pass |
| water boil 3 hrs 100 C. | Pass |

Example 7—Indium Reflective Layer on a Second Surface Coating

A polycarbonate substrate was prepared, cleaned and a hard-coat was applied as described above at Example 2. Consequently, the first surface of the substrate was provided with a hard-coat and unmasked portions of the second surface of the substrate were provided with a hard-coat. These unmasked portions include areas designed for deposition of the reflective layer.

Second Surface Reflective Layer

The hard-coated substrate was prepared for coating with an indium reflective layer as described at Example 4 above.

Overmolding of the Substrate

The second surface of the substrate, having a provided reflective layer, was overmolded with a second radio-transmissive polymer to provide an overmolded layer, using the protocol detailed at Example 2 above Assessment of the Radome Environmental and Visual performance of the radome was assessed using the techniques described above, with the following result:

TABLE 7

| Results | |
| --- | --- |
| Description | Result |
| Photopic reflectivity 2$^{nd}$ surface viewing | 50% |
| Initial appearance | No defects |
| One way radar attenuation 76-77 gHz | <2 dB |
| Dry Heat 115 C. | Pass |
| High temperature ageing 1000 hr @ 80° C. | Pass |
| Humidity Ageing (40° C., 95% RH, 1000 hr) | Pass |
| constant climate test | Pass |
| 240 hrs @ 40 C., 100 RH | |
| Water immersion (240 hr @ 60° C.) | Pass |
| Thermal shock | Pass |
| Thermal cycle | Pass |
| cold temperature ageing | Pass |
| water boil 3 hrs 100 C. | Pass |

Notably, the results of this Example compared to Example 4 indicates that indium can be used as a reflective layer if a second surface reflective coating is provided on portions of the substrate immediately below the applied indium coating.

Example 8—Tin Reflective Layer on a Second Surface Coating

A polycarbonate substrate was prepared, cleaned and a hard-coat was applied as described above at Example 2. Consequently, the first surface of the substrate was provided with a hard-coat and unmasked portions of the second surface of the substrate were provided with a hard-coat. These unmasked portions include areas designed for deposition of the reflective layer.

Second Surface Reflective Layer

The hard-coated substrate was prepared for coating with a reflective layer as described at Example 1 above. The reflective layer of tin was deposited using the following conditions:

Reflective layer-Target: Tin (99.9 wt %)

Argon @ 20 sccm

Pressure=3.5 e$^{-3}$ mbar.

Power @ 400 W

Target to substrate distance=110 mm

Deposition time=3.5 minutes

Thickness=65 nm

Overmolding of the Substrate

The second surface of the substrate, having a provided reflective layer, was overmolded with a second radio-transmissive polymer to provide an overmolded layer, using the protocol detailed at Example 2, above.

Assessment of the Radome

Environmental and Visual performance of the radome was assessed using the techniques described above, with the following result:

TABLE 8

| Results | |
| --- | --- |
| Description | Result |
| Photopic reflectivity 2$^{nd}$ surface viewing | 57% |
| Initial appearance | No defects |
| One way radar attenuation 76-77 gHz | <2 dB |
| Dry Heat 115 C. | Pass |
| High temperature ageing 500 hr @ 80° C. | Pass |
| Humidity Ageing (40° C., 95% RH, 500 hr) | Pass |
| Photopic reflectivity 2$^{nd}$ surface viewing: | Pass |
| 240 hrs @ 40 C., 100 RH | |
| Water immersion (240 hr @ 60° C.) | Pass |
| Thermal shock | Pass |
| Thermal cycle | Pass |
| cold temperature ageing | Pass |
| water boil 3 hrs 100 C. | Pass |

Examples 6 to 8 demonstrate that a multi-layer overmolded radome can be formed including reflective layers formed of post-transition metals such as Indium and Tin, in addition to a metalloid alloys comprising Germanium, in the presence of a second surface hard-coat on the substrate. This is compared to Example 4 where Indium directly applied to the second surface of the substrate (without an interfacing hard-coat) crazed when the second shot was overmolded.

Without wanting to be bound by theory, the second surface hard-coat likely improves binding of the Tin and Indium layer to the substrate and helps control the residual stress of the deposited reflective layer during the thermal expansion caused by the second-shot overmolding. This consequently prevents crazing of the reflective layer as the substrate and reflective layer are heated during overmolding.

All methods described herein can be performed in any suitable order unless indicated otherwise herein or clearly contradicted by context. The use of any and all examples, or exemplary language (e.g., "such as") provided herein, is intended merely to better illuminate the example embodiments and does not intrinsically pose a limitation on the scope of the claimed invention. However, such embodiments may be the subject of a claimed limitation, or may be considered as an additional feature in the event that it is included in a claim. No language in the specification should be construed as indicating any non-claimed element as essential.

The description provided herein is in relation to several embodiments which may share common characteristics and features. It is to be understood that one or more features of one embodiment may be combinable with one or more features of the other embodiments. In addition, a single feature or combination of features of the embodiments may constitute additional embodiments.

The subject headings used herein are included only for the case of reference of the reader and should not be used to limit the subject matter found throughout the disclosure or the claims. The subject headings should not be used in construing the scope of the claims or the claim limitations.

Those skilled in the art will appreciate that the invention described herein is susceptible to variations and modifications other than those specifically described. It is to be understood that the invention includes all such variations and modifications. The invention also includes all of the steps, features and/or functions referred to, or indicated in this specification, individually or collectively, and any and all combinations of any two or more of the steps or features.

Throughout this specification, unless the context requires otherwise, the word "comprise", or variations such as "comprises" or "comprising", will be understood to imply the inclusion of a stated element or integer or group of elements or integers but not the exclusion of any other element or integer or group of elements or integers.

Also, it is to be noted that, as used herein, the singular forms "a", "an" and "the" include plural aspects unless the context already dictates otherwise.

Future patent applications may be filed in Australia or overseas on the basis of or claiming priority from the present application. It is to be understood that the following provisional claims are provided by way of example only, and are not intended to limit the scope of what may be claimed in any such future applications. Also, features may be added to or omitted from the provisional claims at a later date so as to further define or re-define the invention or inventions.

What is claimed is:

1. A decorative radome comprising:
   a first layer comprising a radio-transmissive polymer, the first layer having a front surface;
   a second layer comprising a radio-transmissive polymer, the second layer having a rear surface;
   an intermediate layer between at least a portion of the first layer and the second layer providing at least one functionality to the radome, the intermediate layer comprising at least two sublayers, wherein each of the sublayers provides at least one of the functionalities; and
   a decorative layer, between at least a portion of the first and second layer, comprising a layer of metal or an alloy comprising a metal and a metalloid, wherein
   the second layer directly or indirectly abuts the decorative layer and is directly adhesion bound or indirectly connected to the first layer, and wherein at least one of the first or second layers is comprised of a polymer formed by overmolding at a barrel nozzle temperature below 300 degrees Celsius.

2. The decorative radome according to claim 1, wherein the intermediate layer is ink.

3. The decorative radome according to claim 1, wherein the at least one functionality includes one or more of a visual feature, decorative feature, in addition to the decorative layer, at least one lighting and/or illumination functionality, at least one heating functionality and/or at least one cleaning functionality.

4. The decorative radome according to claim 3, wherein the intermediate layer is located, depending on the functionality provided by the intermediate layer and/or sublayer, between the first layer and the decorative layer or between the decorative layer and the second layer.

5. The decorative radome according to claim 3, wherein the intermediate layer is located, depending on the functionality provided by the intermediate layer and/or sublayer, on a substrate of the decorative radome and/or on the decorative layer.

6. The decorative radome according to claim 3, wherein the intermediate layer, comprises at least one fibre optical device, wherein the fibre optical device allows to direct and/or emit light through and/or into the radome, at least partly in the area of the decorative layer, the visual feature and/or the decorative feature.

7. The decorative radome according to claim 6, wherein the fibre optical device comprises at least one fibre optic string, layered and/or embedded in the at least on intermediate layer and/or sublayer, in form of at least one polymer or film.

8. The decorative radome according to claim 7, wherein the sublayer at least partly comprises the film and/or at least one adhesive promoter is located on at least a part of at least one surface or both surfaces of the film, the intermediate layer and/or the sublayer.

9. The decorative radome according to claim 7, wherein the intermediate layer, the sublayer and/or the film comprise(s) at least partly the fibre optical device and/or is/are at least partly located within a relieved portion of a substrate of the decorative radome, on an elevated portion of the substrate and/or on the decorative layer, wherein the decorative layer has a transmission of less than 15% or less than 10%.

10. The decorative radome according to claim 1, wherein the intermediate layer is connected via a connection element in form of a light guide to a light engine, preferably comprising an LED device.

11. The decorative radome according to claim 1, wherein the intermediate layer comprises at least one or a plurality of heating wires, and/or at least one heating pad, wherein the heating wire is embedded in the intermediate layer and/or the sublayer by partly melting of the intermediate layer and/or the sublayer.

12. The decorative radome according to claim 11, wherein the heating wire is embedded in a pattern, the wire forms at least one frequency selective surface band pass filter, and/or the wire has at least partly a diameter of less than 60 microns, wherein the band pass filter is radio-transmissive.

13. The decorative radome according to claim 1, wherein the intermediate layer comprises at least one piezoelectric element allowing the generation of ultrasonic waves and/or sound.

14. The decorative radome according to claim 1, wherein the intermediate layer is coloured and/or is not substantially overlaid with the decorative layer.

15. The decorative radome according to claim 1, further comprising at least one cladding layer being at least partly located between a masking on a substrate of the decorative radome, the intermediate layer and the first layer.

16. The decorative radome according to claim 1, further comprising a hard-coat layer.

17. The decorative radome according to claim 16, wherein the hard-coat layer covers at least a portion of the front surface of the first layer, is between at least a portion of the first layer and the decorative layer and/or covers at least a portion of the rear surface of the second layer.

18. The decorative radome according to claim 1, wherein the front surface and the rear surface of the radome are substantially parallel, over at least a portion of the decorative radome defining a radio path.

19. The decorative radome according to claim 1, wherein the decorative layer is a reflective layer.

20. The decorative radome according to claim 19, wherein the reflective layer is at least 35% reflective or photopic reflective.

21. The decorative radome according to claim 1, wherein the decorative layer comprises indium, tin or an alloy comprising a metal and germanium and/or silicon.

22. The decorative radome according to claim 1, wherein the decorative layer comprises an alloy of aluminium and/or germanium and/or silicon.

23. The decorative radome according to claim 21, wherein the alloy comprises germanium, and wherein the concentration of germanium is at least 25 wt % germanium.

24. The decorative radome according to claim 21, wherein the decorative layer is 20 to 190 nm thick.

25. The decorative radome according to claim 1, wherein at least a portion of the front surface of the first layer and/or at least a portion of the rear surface of the second layer has a hard-coat.

26. The decorative radome according to claim 16, wherein the hard-coat has a thickness of 6 μm to 28 μm.

27. The decorative radome according to claim 16, wherein the hard-coat comprises one or more abrasion resistant layers comprising a material selected from the group consisting of an organo-silicon, an acrylic, a urethane, and melamine.

28. The decorative radome according to claim 1, wherein one or both of the first and/or second layers is/are formed of Acrylonitrile Ethylene Styrene (AES), Acrylonitrile butadiene styrene (ABS), polycarbonate (PC), high-flow AES or acrylonitrile-(ethylene-propylene-diene)-styrene (AEPDS), a blend of thermoplastics, or PC-ABS blended thermoplastic.

29. The decorative radome according to claim 1, wherein one or both of the first and/or second layers is/are formed of polycarbonate.

30. The decorative radome according to claim 1, wherein the radome does not substantially attenuate electromagnetic frequencies of 10 MHz-3000 GHz.

31. The decorative radome according to claim 1, wherein the radome has a radio wave signal attenuation less than 2 dB (one way) across a signal path, or less than 1 dB (one way) across a signal path.

32. The decorative radome according to claim 1, wherein the decorative layer has a sheet resistivity greater than $10^6$ ohms per square.

33. The decorative radome according to claim 1, wherein there is no water ingress between the first layer and the second layer when the radome is immersed in water at 60° C. for 240 hours.

34. A decorative radome comprising:

a first layer comprising a radio-transmissive polymer, the first layer having a front surface;

a second layer comprising a radio-transmissive polymer, the second layer having a rear surface;

an intermediate layer between at least a portion of the first layer and the second layer providing at least one functionality to the radome, the intermediate layer comprising at least two sublayers, wherein each of the sublayers provides at least one of the functionalities; and a decorative layer, between at least a portion of the first and second layer, comprising a layer of metal or an alloy comprising a metal and a metalloid, wherein the second layer directly or indirectly abuts the decorative layer and is directly adhesion bound or indirectly connected to the first layer, wherein at least one of the first or second layers is comprised of a polymer capable of being formed by overmolding at a barrel nozzle temperature below 300 degrees Celsius, and wherein the decorative radome further includes an intermediate layer between at least a portion of the first layer and the second layer, wherein the intermediate layer is ink, and/or provides at least one functionality, in form of at least one lighting and/or illumination functionality, at least one heating functionality and/or at least one cleaning functionality, and/or is colored, and/or is not substantially overlaid with the decorative layer.

35. The decorative radome according to claim 6, further comprising at least one light engine, or LED light engine connected to the fibre optic device via at least one connection element, wherein the connection element is at least partly located in and/or connected to the intermediate layer, the sublayer, the film, the first layer and/or the second layer and/or optically connected to the first layer or the front surface.

36. The decorative radome according to claim 34, wherein the fibre optical device and/or the connection element comprise(s) at least one dielectric material, glass and/or a polymer.

\* \* \* \* \*